(12) United States Patent
Katkar

(10) Patent No.: US 9,837,330 B2
(45) Date of Patent: Dec. 5, 2017

(54) FINE PITCH BVA USING RECONSTITUTED WAFER WITH AREA ARRAY ACCESSIBLE FOR TESTING

(71) Applicant: Invensas Corporation, San Jose, CA (US)

(72) Inventor: Rajesh Katkar, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/422,887

(22) Filed: Feb. 2, 2017

(65) Prior Publication Data

US 2017/0148696 A1  May 25, 2017

Related U.S. Application Data

(63) Continuation of application No. 14/157,790, filed on Jan. 17, 2014, now Pat. No. 9,583,411.

(51) Int. Cl.
*H01L 21/4763* (2006.01)
*H01L 23/31* (2006.01)
(Continued)

(52) U.S. Cl.
CPC ........ *H01L 23/3107* (2013.01); *H01L 21/561* (2013.01); *H01L 21/78* (2013.01);
(Continued)

(58) Field of Classification Search
CPC .................................................. H01L 21/4763
See application file for complete search history.

(56) References Cited

U.S. PATENT DOCUMENTS 3,289,452 A   12/1966  Koellner
3,358,897 A   12/1967  Christensen
(Continued)

FOREIGN PATENT DOCUMENTS

CN   1352804 A   6/2002
CN   1641832 A   7/2005
(Continued)

OTHER PUBLICATIONS

Neo-Manhattan Technology, A Novel HDI Manufacturing Process, "High-Density Interconnects for Advanced Flex Substrates & 3-D Package Stacking," IPC Flex & Chips Symposium, Tempe, AZ, Feb. 11-12, 2003.
(Continued)

*Primary Examiner* — Marvin Payen
(74) *Attorney, Agent, or Firm* — Lerner, David, Littenberg, Krumholz & Mentlik, LLP

(57) ABSTRACT

A method for simultaneously making a plurality of microelectronic packages by forming an electrically conductive redistribution structure along with a plurality of microelectronic element attachment regions on a carrier. The attachment regions being spaced apart from one another and overlying the carrier. The method also including the formation of conductive connector elements between adjacent attachment regions. Each connector element having the first or second end adjacent the carrier and the remaining end at a height of the microelectronic element. The method also includes forming an encapsulation over portions of the connector elements and subsequently singulating the assembly. into microelectronic units, each including a microelectronic element. The surface of the microelectronic unit, opposite the redistribution structure, having both the active face of the microelectronic element and the free ends of the
(Continued)

connector elements so that both are available for connection with a component external to the microelectronic unit.

20 Claims, 16 Drawing Sheets

(51) Int. Cl.
*H01L 21/56* (2006.01)
*H01L 21/78* (2006.01)
*H01L 23/00* (2006.01)

(52) U.S. Cl.
CPC .............. *H01L 24/11* (2013.01); *H01L 24/13* (2013.01); *H01L 24/94* (2013.01); *H01L 2224/12105* (2013.01); *H01L 2224/13024* (2013.01); *H01L 2224/13025* (2013.01)

(56) References Cited

U.S. PATENT DOCUMENTS

| | | |
|---|---|---|
| 3,430,835 A | 3/1969 | Grable et al. |
| 3,623,649 A | 11/1971 | Keisling |
| 3,795,037 A | 3/1974 | Luttmer |
| 3,900,153 A | 8/1975 | Beerwerth et al. |
| 4,067,104 A | 1/1978 | Tracy |
| 4,213,556 A | 7/1980 | Persson et al. |
| 4,327,860 A | 5/1982 | Kirshenboin et al. |
| 4,422,568 A | 12/1983 | Elles et al. |
| 4,437,604 A | 3/1984 | Razon et al. |
| 4,604,644 A | 8/1986 | Beckham et al. |
| 4,642,889 A | 2/1987 | Grabbe |
| 4,695,870 A | 9/1987 | Patraw |
| 4,716,049 A | 12/1987 | Patraw |
| 4,771,930 A | 9/1988 | Gillotti et al. |
| 4,793,814 A | 12/1988 | Zifcak et al. |
| 4,804,132 A | 2/1989 | DiFrancesco |
| 4,845,354 A | 7/1989 | Gupta et al. |
| 4,902,600 A | 2/1990 | Tamagawa et al. |
| 4,924,353 A | 5/1990 | Patraw |
| 4,925,083 A | 5/1990 | Farassat et al. |
| 4,955,523 A | 9/1990 | Carlommagno et al. |
| 4,975,079 A | 12/1990 | Beaman et al. |
| 4,982,265 A | 1/1991 | Watanabe et al. |
| 4,998,885 A | 3/1991 | Beaman |
| 4,999,472 A | 3/1991 | Neinast et al. |
| 5,067,007 A | 11/1991 | Otsuka et al. |
| 5,067,382 A | 11/1991 | Zimmerman et al. |
| 5,083,697 A | 1/1992 | Difrancesco |
| 5,095,187 A | 3/1992 | Gliga |
| 5,133,495 A | 7/1992 | Angulas et al. |
| 5,138,438 A | 8/1992 | Masayuki et al. |
| 5,148,265 A | 9/1992 | Khandros et al. |
| 5,148,266 A | 9/1992 | Khandros et al. |
| 5,186,381 A | 2/1993 | Kim |
| 5,189,505 A | 2/1993 | Bartelink |
| 5,196,726 A | 3/1993 | Nishiguchi et al. |
| 5,203,075 A | 4/1993 | Angulas et al. |
| 5,214,308 A | 5/1993 | Nishiguchi et al. |
| 5,220,489 A | 6/1993 | Barreto et al. |
| 5,222,014 A | 6/1993 | Lin |
| 5,238,173 A | 8/1993 | Ura et al. |
| 5,241,456 A | 8/1993 | Marcinkiewicz et al. |
| 5,316,788 A | 5/1994 | Dibble et al. |
| 5,340,771 A | 8/1994 | Rostoker |
| 5,346,118 A | 9/1994 | Degani et al. |
| 5,371,654 A | 12/1994 | Beaman et al. |
| 5,397,997 A | 3/1995 | Tuckerman et al. |
| 5,438,224 A | 8/1995 | Papageorge et al. |
| 5,455,390 A | 10/1995 | DiStefano et al. |
| 5,468,995 A | 11/1995 | Higgins, III |
| 5,494,667 A | 2/1996 | Uchida et al. |
| 5,495,667 A | 3/1996 | Farnworth et al. |
| 5,518,964 A | 5/1996 | DiStefano et al. |
| 5,531,022 A | 7/1996 | Beaman et al. |
| 5,536,909 A | 7/1996 | DiStefano et al. |
| 5,541,567 A | 7/1996 | Fogel et al. |
| 5,571,428 A | 11/1996 | Nishimura et al. |
| 5,608,265 A | 3/1997 | Kitano et al. |
| 5,615,824 A | 4/1997 | Fjelstad et al. |
| 5,635,846 A | 6/1997 | Beaman et al. |
| 5,656,550 A | 8/1997 | Tsuji et al. |
| 5,659,952 A | 8/1997 | Kovac et al. |
| 5,679,977 A | 10/1997 | Khandros et al. |
| 5,688,716 A | 11/1997 | DiStefano et al. |
| 5,718,361 A | 2/1998 | Braun et al. |
| 5,726,493 A | 3/1998 | Yamashita et al. |
| 5,731,709 A | 3/1998 | Pastore et al. |
| 5,736,780 A | 4/1998 | Murayama |
| 5,766,987 A | 6/1998 | Mitchell et al. |
| 5,787,581 A | 8/1998 | DiStefano et al. |
| 5,801,441 A | 9/1998 | DiStefano et al. |
| 5,802,699 A | 9/1998 | Fjelstad et al. |
| 5,811,982 A | 9/1998 | Beaman et al. |
| 5,821,763 A | 10/1998 | Beaman et al. |
| 5,830,389 A | 11/1998 | Capote et al. |
| 5,831,836 A | 11/1998 | Long et al. |
| 5,839,191 A | 11/1998 | Economy et al. |
| 5,854,507 A | 12/1998 | Miremadi et al. |
| 5,898,991 A | 5/1999 | Fogel et al. |
| 5,908,317 A | 6/1999 | Heo |
| 5,912,505 A | 6/1999 | Itoh et al. |
| 5,948,533 A | 9/1999 | Gallagher et al. |
| 5,953,624 A | 9/1999 | Bando et al. |
| 5,971,253 A | 10/1999 | Gilleo et al. |
| 5,973,391 A | 10/1999 | Bischoff et al. |
| 5,977,618 A | 11/1999 | DiStefano et al. |
| 5,980,270 A | 11/1999 | Fjelstad et al. |
| 5,989,936 A | 11/1999 | Smith et al. |
| 5,994,152 A | 11/1999 | Khandros et al. |
| 6,000,126 A | 12/1999 | Pai |
| 6,002,168 A | 12/1999 | Bellaar et al. |
| 6,032,359 A | 3/2000 | Carroll |
| 6,038,136 A | 3/2000 | Weber |
| 6,052,287 A | 4/2000 | Palmer et al. |
| 6,054,337 A | 4/2000 | Solberg |
| 6,054,756 A | 4/2000 | DiStefano et al. |
| 6,077,380 A | 6/2000 | Hayes et al. |
| 6,117,694 A | 9/2000 | Smith et al. |
| 6,121,676 A | 9/2000 | Solberg |
| 6,124,546 A | 9/2000 | Hayward et al. |
| 6,133,072 A | 10/2000 | Fjelstad |
| 6,145,733 A | 11/2000 | Streckfuss et al. |
| 6,157,080 A | 12/2000 | Tamaki et al. |
| 6,158,647 A | 12/2000 | Chapman et al. |
| 6,164,523 A | 12/2000 | Fauty et al. |
| 6,168,965 B1 | 1/2001 | Malinovich et al. |
| 6,177,636 B1 | 1/2001 | Fjelstad |
| 6,180,881 B1 | 1/2001 | Isaak |
| 6,194,250 B1 | 2/2001 | Melton et al. |
| 6,194,291 B1 | 2/2001 | DiStefano et al. |
| 6,202,297 B1 | 3/2001 | Faraci et al. |
| 6,206,273 B1 | 3/2001 | Beaman et al. |
| 6,208,024 B1 | 3/2001 | DiStefano |
| 6,211,572 B1 | 4/2001 | Fjelstad et al. |
| 6,211,574 B1 | 4/2001 | Tao et al. |
| 6,215,670 B1 | 4/2001 | Khandros |
| 6,218,728 B1 | 4/2001 | Kimura |
| 6,225,688 B1 | 5/2001 | Kim et al. |
| 6,258,625 B1 | 7/2001 | Brofman et al. |
| 6,260,264 B1 | 7/2001 | Chen et al. |
| 6,262,482 B1 | 7/2001 | Shiraishi et al. |
| 6,268,662 B1 | 7/2001 | Test et al. |
| 6,295,729 B1 | 10/2001 | Beaman et al. |
| 6,300,780 B1 | 10/2001 | Beaman et al. |
| 6,303,997 B1 | 10/2001 | Lee et al. |
| 6,313,528 B1 | 11/2001 | Solberg |
| 6,316,838 B1 | 11/2001 | Ozawa et al. |
| 6,329,224 B1 | 12/2001 | Nguyen et al. |
| 6,332,270 B2 | 12/2001 | Beaman et al. |
| 6,334,247 B1 | 1/2002 | Beaman et al. |
| 6,358,627 B2 | 3/2002 | Benenati et al. |
| 6,362,520 B2 | 3/2002 | DiStefano |
| 6,362,525 B1 | 3/2002 | Rahim |

(56) References Cited

U.S. PATENT DOCUMENTS

| | | |
|---|---|---|
| 6,376,769 B1 | 4/2002 | Chung |
| 6,388,333 B1 | 5/2002 | Taniguchi et al. |
| 6,399,426 B1 | 6/2002 | Capote et al. |
| 6,407,448 B2 | 6/2002 | Chun |
| 6,413,850 B1 | 7/2002 | Ooroku et al. |
| 6,439,450 B1 | 8/2002 | Chapman et al. |
| 6,458,411 B1 | 10/2002 | Goossen et al. |
| 6,476,503 B1 | 11/2002 | Imamura et al. |
| 6,476,583 B2 | 11/2002 | McAndrews |
| 6,489,182 B2 | 12/2002 | Kwon |
| 6,495,914 B1 | 12/2002 | Sekine et al. |
| 6,507,104 B2 | 1/2003 | Ho et al. |
| 6,509,639 B1 | 1/2003 | Lin |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,526,655 B2 | 3/2003 | Beaman et al. |
| 6,531,784 B1 | 3/2003 | Shim et al. |
| 6,545,228 B2 | 4/2003 | Hashimoto |
| 6,550,666 B2 | 4/2003 | Chew et al. |
| 6,555,918 B2 | 4/2003 | Masuda et al. |
| 6,560,117 B2 | 5/2003 | Moon |
| 6,573,458 B1 | 6/2003 | Matsubara et al. |
| 6,578,754 B1 | 6/2003 | Tung |
| 6,581,283 B2 | 6/2003 | Sugiura et al. |
| 6,624,653 B1 | 9/2003 | Cram |
| 6,630,730 B2 | 10/2003 | Grigg |
| 6,647,310 B1 | 11/2003 | Yi et al. |
| 6,653,170 B1 | 11/2003 | Lin |
| 6,684,007 B2 | 1/2004 | Yoshimura et al. |
| 6,687,988 B1 | 2/2004 | Sugiura et al. |
| 6,699,730 B2 | 3/2004 | Kim et al. |
| 6,708,403 B2 | 3/2004 | Beaman et al. |
| 6,730,544 B1 | 5/2004 | Yang |
| 6,734,542 B2 | 5/2004 | Nakatani et al. |
| 6,746,894 B2 | 6/2004 | Fee et al. |
| 6,759,738 B1 | 7/2004 | Fallon et al. |
| 6,762,078 B2 | 7/2004 | Shin et al. |
| 6,765,287 B1 | 7/2004 | Lin |
| 6,774,467 B2 | 8/2004 | Horiuchi et al. |
| 6,774,473 B1 | 8/2004 | Shen |
| 6,774,494 B2 | 8/2004 | Arakawa |
| 6,777,787 B2 | 8/2004 | Shibata |
| 6,777,797 B2 | 8/2004 | Egawa |
| 6,778,406 B2 | 8/2004 | Grube et al. |
| 6,790,757 B1 | 9/2004 | Chittipeddi et al. |
| 6,815,257 B2 | 11/2004 | Yoon et al. |
| 6,828,668 B2 | 12/2004 | Smith et al. |
| 6,844,619 B2 | 1/2005 | Tago |
| 6,856,235 B2 | 2/2005 | Fjelstad |
| 6,867,499 B1 | 3/2005 | Tabrizi |
| 6,897,565 B2 | 5/2005 | Pflughaupt et al. |
| 6,900,530 B1 | 5/2005 | Tsai |
| 6,902,869 B2 | 6/2005 | Appelt et al. |
| 6,902,950 B2 | 6/2005 | Ma et al. |
| 6,930,256 B1 | 8/2005 | Huemoeller et al. |
| 6,933,608 B2 | 8/2005 | Fujisawa |
| 6,946,380 B2 | 9/2005 | Takahashi |
| 6,962,282 B2 | 11/2005 | Manansala |
| 6,962,864 B1 | 11/2005 | Jeng et al. |
| 6,977,440 B2 | 12/2005 | Pflughaupt et al. |
| 6,979,599 B2 | 12/2005 | Silverbrook |
| 6,987,032 B1 | 1/2006 | Fan et al. |
| 6,989,122 B1 | 1/2006 | Pham et al. |
| 7,009,297 B1 | 3/2006 | Chiang et al. |
| 7,045,884 B2 | 5/2006 | Standing |
| 7,051,915 B2 | 5/2006 | Mutaguchi |
| 7,053,485 B2 | 5/2006 | Bang et al. |
| 7,061,079 B2 | 6/2006 | Weng et al. |
| 7,061,097 B2 | 6/2006 | Yokoi |
| 7,067,911 B1 | 6/2006 | Lin et al. |
| 7,071,547 B2 | 7/2006 | Kang et al. |
| 7,071,573 B1 | 7/2006 | Lin |
| 7,119,427 B2 | 10/2006 | Kim |
| 7,121,891 B2 | 10/2006 | Cherian |
| 7,170,185 B1 | 1/2007 | Hogerton et al. |
| 7,176,506 B2 | 2/2007 | Beroz et al. |
| 7,176,559 B2 | 2/2007 | Ho et al. |
| 7,185,426 B1 | 3/2007 | Hiner et al. |
| 7,190,061 B2 | 3/2007 | Lee |
| 7,205,670 B2 | 4/2007 | Oyama |
| 7,215,033 B2 | 5/2007 | Lee et al. |
| 7,225,538 B2 | 6/2007 | Eldridge et al. |
| 7,227,095 B2 | 6/2007 | Roberts et al. |
| 7,229,906 B2 | 6/2007 | Babinetz et al. |
| 7,233,057 B2 | 6/2007 | Hussa |
| 7,242,081 B1 | 7/2007 | Lee |
| 7,246,431 B2 | 7/2007 | Bang et al. |
| 7,262,124 B2 | 8/2007 | Fujisawa |
| 7,268,421 B1 | 9/2007 | Lin |
| 7,276,799 B2 | 10/2007 | Lee et al. |
| 7,294,920 B2 | 11/2007 | Chen et al. |
| 7,294,928 B2 | 11/2007 | Bang et al. |
| 7,323,767 B2 | 1/2008 | James et al. |
| 7,344,917 B2 | 3/2008 | Gautham |
| 7,365,416 B2 | 4/2008 | Kawabata et al. |
| 7,371,676 B2 | 5/2008 | Hembree |
| 7,372,151 B1 | 5/2008 | Fan et al. |
| 7,391,105 B2 | 6/2008 | Yeom |
| 7,391,121 B2 | 6/2008 | Otremba |
| 7,416,107 B2 | 8/2008 | Chapman et al. |
| 7,453,157 B2 | 11/2008 | Haba et al. |
| 7,456,091 B2 | 11/2008 | Kuraya et al. |
| 7,462,936 B2 | 12/2008 | Haba et al. |
| 7,476,608 B2 | 1/2009 | Craig et al. |
| 7,476,962 B2 | 1/2009 | Kim |
| 7,485,562 B2 | 2/2009 | Chua et al. |
| 7,495,342 B2 | 2/2009 | Beaman et al. |
| 7,517,733 B2 | 4/2009 | Camacho et al. |
| 7,538,565 B1 | 5/2009 | Beaman et al. |
| 7,550,836 B2 | 6/2009 | Chou et al. |
| 7,576,439 B2 | 8/2009 | Craig et al. |
| 7,578,422 B2 | 8/2009 | Lange et al. |
| 7,589,394 B2 | 9/2009 | Kawano |
| 7,621,436 B2 | 11/2009 | Mii et al. |
| 7,625,781 B2 | 12/2009 | Beer |
| 7,633,765 B1 | 12/2009 | Scanlan et al. |
| 7,642,133 B2 | 1/2010 | Wu et al. |
| 7,646,102 B2 | 1/2010 | Boon |
| 7,671,457 B1 | 3/2010 | Hiner et al. |
| 7,671,459 B2 | 3/2010 | Corisis et al. |
| 7,675,152 B2 | 3/2010 | Gerber et al. |
| 7,677,429 B2 | 3/2010 | Chapman et al. |
| 7,682,962 B2 | 3/2010 | Hembree |
| 7,709,968 B2 | 5/2010 | Damberg et al. |
| 7,719,122 B2 | 5/2010 | Tsao et al. |
| 7,728,443 B2 | 6/2010 | Hembree |
| 7,737,545 B2 | 6/2010 | Fjelstad et al. |
| 7,750,483 B1 | 7/2010 | Lin et al. |
| 7,757,385 B2 | 7/2010 | Hembree |
| 7,777,351 B1 | 8/2010 | Berry et al. |
| 7,780,064 B2 | 8/2010 | Wong et al. |
| 7,781,877 B2 | 8/2010 | Jiang et al. |
| 7,795,717 B2 | 9/2010 | Goller |
| 7,808,093 B2 | 10/2010 | Kagaya et al. |
| 7,842,541 B1 | 11/2010 | Rusli et al. |
| 7,850,087 B2 | 12/2010 | Hwang et al. |
| 7,855,462 B2 | 12/2010 | Boon et al. |
| 7,857,190 B2 | 12/2010 | Takahashi et al. |
| 7,880,290 B2 | 2/2011 | Park |
| 7,892,889 B2 | 2/2011 | Howard et al. |
| 7,902,644 B2 | 3/2011 | Huang et al. |
| 7,911,805 B2 | 3/2011 | Haba |
| 7,919,846 B2 | 4/2011 | Hembree |
| 7,928,552 B1 | 4/2011 | Cho et al. |
| 7,932,170 B1 | 4/2011 | Huemoeller et al. |
| 7,934,313 B1 | 5/2011 | Lin et al. |
| 7,939,934 B2 | 5/2011 | Haba et al. |
| 7,964,956 B1 | 6/2011 | Bet-Shliemoun |
| 7,967,062 B2 | 6/2011 | Campbell et al. |
| 7,977,597 B2 | 7/2011 | Roberts et al. |
| 8,012,797 B2 | 9/2011 | Shen et al. |
| 8,020,290 B2 | 9/2011 | Sheats |
| 8,035,213 B2 | 10/2011 | Lee et al. |

(56) References Cited

U.S. PATENT DOCUMENTS

| | | |
|---|---|---|
| 8,039,970 B2 | 10/2011 | Yamamori et al. |
| 8,053,879 B2 | 11/2011 | Lee et al. |
| 8,058,101 B2 | 11/2011 | Haba et al. |
| 8,071,431 B2 | 12/2011 | Hoang et al. |
| 8,071,470 B2 | 12/2011 | Khor et al. |
| 8,076,770 B2 | 12/2011 | Kagaya et al. |
| 8,084,867 B2 | 12/2011 | Tang et al. |
| 8,092,734 B2 | 1/2012 | Jiang et al. |
| 8,093,697 B2 | 1/2012 | Haba et al. |
| 8,207,604 B2 | 6/2012 | Haba et al. |
| 8,213,184 B2 | 7/2012 | Knickerbocker |
| 8,217,502 B2 | 7/2012 | Ko |
| 8,232,141 B2 | 7/2012 | Choi et al. |
| 8,264,091 B2 | 9/2012 | Cho et al. |
| 8,278,746 B2 | 10/2012 | Ding et al. |
| 8,299,368 B2 | 10/2012 | Endo |
| 8,304,900 B2 | 11/2012 | Jang et al. |
| 8,314,492 B2 | 11/2012 | Egawa |
| 8,319,338 B1 | 11/2012 | Berry et al. |
| 8,372,741 B1 | 2/2013 | Co et al. |
| 8,404,520 B1 | 3/2013 | Chau et al. |
| 8,482,111 B2 | 7/2013 | Haba |
| 8,525,314 B2 | 9/2013 | Haba et al. |
| 8,525,318 B1 | 9/2013 | Kim et al. |
| 8,618,659 B2 | 12/2013 | Sato et al. |
| 8,659,164 B2 | 2/2014 | Haba |
| 8,680,684 B2 | 3/2014 | Haba et al. |
| 8,728,865 B2 | 5/2014 | Haba et al. |
| 8,836,136 B2 | 9/2014 | Chau et al. |
| 8,878,353 B2 | 11/2014 | Haba et al. |
| 8,907,466 B2 | 12/2014 | Haba |
| 8,927,337 B2 | 1/2015 | Haba et al. |
| 8,987,132 B2 | 3/2015 | Gruber et al. |
| 9,093,435 B2 | 7/2015 | Sato et al. |
| 9,095,074 B2 | 7/2015 | Haba et al. |
| 9,105,483 B2 | 8/2015 | Chau et al. |
| 9,123,664 B2 | 9/2015 | Haba |
| 9,136,254 B2 | 9/2015 | Zhao et al. |
| 9,153,562 B2 | 10/2015 | Haba et al. |
| 9,224,717 B2 | 12/2015 | Sato et al. |
| 9,570,382 B2 | 2/2017 | Haba |
| 2001/0002607 A1 | 6/2001 | Sugiura et al. |
| 2001/0006252 A1 | 7/2001 | Kim et al. |
| 2001/0007370 A1 | 7/2001 | Distefano |
| 2001/0021541 A1 | 9/2001 | Akram et al. |
| 2001/0028114 A1 | 10/2001 | Hosomi |
| 2001/0040280 A1 | 11/2001 | Funakura et al. |
| 2001/0042925 A1 | 11/2001 | Yamamoto et al. |
| 2001/0045012 A1 | 11/2001 | Beaman et al. |
| 2001/0048151 A1 | 12/2001 | Chun |
| 2002/0014004 A1 | 2/2002 | Beaman et al. |
| 2002/0066952 A1 | 6/2002 | Taniguchi et al. |
| 2002/0096787 A1 | 7/2002 | Fjelstad |
| 2002/0117330 A1 | 8/2002 | Eldridge et al. |
| 2002/0125571 A1 | 9/2002 | Corisis et al. |
| 2002/0153602 A1 | 10/2002 | Tay et al. |
| 2002/0164838 A1 | 11/2002 | Moon et al. |
| 2002/0171152 A1 | 11/2002 | Miyazaki |
| 2002/0185735 A1 | 12/2002 | Sakurai et al. |
| 2002/0190738 A1 | 12/2002 | Beaman et al. |
| 2003/0002770 A1 | 1/2003 | Chakravorty et al. |
| 2003/0006494 A1 | 1/2003 | Lee et al. |
| 2003/0048108 A1 | 3/2003 | Beaman et al. |
| 2003/0057544 A1 | 3/2003 | Nathan et al. |
| 2003/0068906 A1 | 4/2003 | Light et al. |
| 2003/0094666 A1 | 5/2003 | Clayton et al. |
| 2003/0094685 A1 | 5/2003 | Shiraishi et al. |
| 2003/0094700 A1 | 5/2003 | Aiba et al. |
| 2003/0106213 A1 | 6/2003 | Beaman et al. |
| 2003/0107118 A1 | 6/2003 | Pflughaupt et al. |
| 2003/0124767 A1 | 7/2003 | Lee et al. |
| 2003/0162378 A1 | 8/2003 | Mikami |
| 2003/0164540 A1 | 9/2003 | Lee et al. |
| 2003/0234277 A1 | 12/2003 | Dias et al. |
| 2004/0014309 A1 | 1/2004 | Nakanishi |
| 2004/0036164 A1 | 2/2004 | Koike et al. |
| 2004/0038447 A1 | 2/2004 | Corisis et al. |
| 2004/0075164 A1 | 4/2004 | Pu et al. |
| 2004/0090756 A1 | 5/2004 | Ho et al. |
| 2004/0110319 A1 | 6/2004 | Fukutomi et al. |
| 2004/0119152 A1 | 6/2004 | Karnezos et al. |
| 2004/0124518 A1 | 7/2004 | Karnezos |
| 2004/0148773 A1 | 8/2004 | Beaman et al. |
| 2004/0152292 A1 | 8/2004 | Babinetz et al. |
| 2004/0160751 A1 | 8/2004 | Inagaki et al. |
| 2004/0164426 A1 | 8/2004 | Pai et al. |
| 2004/0188499 A1 | 9/2004 | Nosaka |
| 2004/0262728 A1 | 12/2004 | Sterrett et al. |
| 2004/0262734 A1 | 12/2004 | Yoo |
| 2005/0017369 A1 | 1/2005 | Clayton et al. |
| 2005/0035440 A1 | 2/2005 | Mohammed |
| 2005/0062173 A1 | 3/2005 | Vu et al. |
| 2005/0062492 A1 | 3/2005 | Beaman et al. |
| 2005/0082664 A1 | 4/2005 | Funaba et al. |
| 2005/0095835 A1 | 5/2005 | Humpston et al. |
| 2005/0116326 A1 | 6/2005 | Haba et al. |
| 2005/0121764 A1 | 6/2005 | Mallik et al. |
| 2005/0133916 A1 | 6/2005 | Karnezos |
| 2005/0133932 A1 | 6/2005 | Pohl et al. |
| 2005/0140265 A1 | 6/2005 | Hirakata |
| 2005/0146008 A1 | 7/2005 | Miyamoto et al. |
| 2005/0151235 A1 | 7/2005 | Yokoi |
| 2005/0151238 A1 | 7/2005 | Yamunan |
| 2005/0173805 A1 | 8/2005 | Damberg et al. |
| 2005/0173807 A1 | 8/2005 | Zhu et al. |
| 2005/0181544 A1 | 8/2005 | Haba et al. |
| 2005/0181655 A1 | 8/2005 | Haba et al. |
| 2005/0212109 A1 | 9/2005 | Cherukuri et al. |
| 2005/0253213 A1 | 11/2005 | Jiang et al. |
| 2005/0266672 A1 | 12/2005 | Jeng et al. |
| 2005/0285246 A1 | 12/2005 | Haba et al. |
| 2006/0118641 A1 | 6/2006 | Hwang et al. |
| 2006/0139893 A1 | 6/2006 | Yoshimura et al. |
| 2006/0166397 A1 | 7/2006 | Lau et al. |
| 2006/0197220 A1 | 9/2006 | Beer |
| 2006/0228825 A1 | 10/2006 | Hembree |
| 2006/0255449 A1 | 11/2006 | Lee et al. |
| 2006/0278682 A1 | 12/2006 | Lange et al. |
| 2006/0278970 A1 | 12/2006 | Yano et al. |
| 2007/0013067 A1 | 1/2007 | Nishida et al. |
| 2007/0015353 A1 | 1/2007 | Craig et al. |
| 2007/0035015 A1 | 2/2007 | Hsu |
| 2007/0045803 A1 | 3/2007 | Ye et al. |
| 2007/0090524 A1 | 4/2007 | Abbott |
| 2007/0126091 A1 | 6/2007 | Wood et al. |
| 2007/0148822 A1 | 6/2007 | Haba et al. |
| 2007/0181989 A1 | 8/2007 | Corisis et al. |
| 2007/0190747 A1 | 8/2007 | Humpston et al. |
| 2007/0235850 A1 | 10/2007 | Gerber et al. |
| 2007/0235856 A1 | 10/2007 | Haba et al. |
| 2007/0241437 A1 | 10/2007 | Kagaya et al. |
| 2007/0246819 A1 | 10/2007 | Hembree et al. |
| 2007/0254406 A1 | 11/2007 | Lee |
| 2007/0271781 A9 | 11/2007 | Beaman et al. |
| 2007/0290325 A1 | 12/2007 | Wu et al. |
| 2008/0006942 A1 | 1/2008 | Park et al. |
| 2008/0017968 A1 | 1/2008 | Choi et al. |
| 2008/0029849 A1 | 2/2008 | Hedler et al. |
| 2008/0032519 A1 | 2/2008 | Murata |
| 2008/0047741 A1 | 2/2008 | Beaman et al. |
| 2008/0048309 A1 | 2/2008 | Corisis et al. |
| 2008/0048690 A1 | 2/2008 | Beaman et al. |
| 2008/0048691 A1 | 2/2008 | Beaman et al. |
| 2008/0048697 A1 | 2/2008 | Beaman et al. |
| 2008/0054434 A1 | 3/2008 | Kim |
| 2008/0073769 A1 | 3/2008 | Wu et al. |
| 2008/0073771 A1 | 3/2008 | Seo et al. |
| 2008/0076208 A1 | 3/2008 | Wu et al. |
| 2008/0100316 A1 | 5/2008 | Beaman et al. |
| 2008/0100317 A1 | 5/2008 | Beaman et al. |
| 2008/0100318 A1 | 5/2008 | Beaman et al. |
| 2008/0100324 A1 | 5/2008 | Beaman et al. |
| 2008/0105984 A1 | 5/2008 | Lee |
| 2008/0106281 A1 | 5/2008 | Beaman et al. |

(56) References Cited

U.S. PATENT DOCUMENTS

| | | |
|---|---|---|
| 2008/0106282 A1 | 5/2008 | Beaman et al. |
| 2008/0106283 A1 | 5/2008 | Beaman et al. |
| 2008/0106284 A1 | 5/2008 | Beaman et al. |
| 2008/0106285 A1 | 5/2008 | Beaman et al. |
| 2008/0106291 A1 | 5/2008 | Beaman et al. |
| 2008/0106872 A1 | 5/2008 | Beaman et al. |
| 2008/0111568 A1 | 5/2008 | Beaman et al. |
| 2008/0111569 A1 | 5/2008 | Beaman et al. |
| 2008/0111570 A1 | 5/2008 | Beaman et al. |
| 2008/0112144 A1 | 5/2008 | Beaman et al. |
| 2008/0112145 A1 | 5/2008 | Beaman et al. |
| 2008/0112146 A1 | 5/2008 | Beaman et al. |
| 2008/0112147 A1 | 5/2008 | Beaman et al. |
| 2008/0112148 A1 | 5/2008 | Beaman et al. |
| 2008/0112149 A1 | 5/2008 | Beaman et al. |
| 2008/0116912 A1 | 5/2008 | Beaman et al. |
| 2008/0116913 A1 | 5/2008 | Beaman et al. |
| 2008/0116914 A1 | 5/2008 | Beaman et al. |
| 2008/0116915 A1 | 5/2008 | Beaman et al. |
| 2008/0116916 A1 | 5/2008 | Beaman et al. |
| 2008/0117611 A1 | 5/2008 | Beaman et al. |
| 2008/0117612 A1 | 5/2008 | Beaman et al. |
| 2008/0117613 A1 | 5/2008 | Beaman et al. |
| 2008/0121879 A1 | 5/2008 | Beaman et al. |
| 2008/0123310 A1 | 5/2008 | Beaman et al. |
| 2008/0129319 A1 | 6/2008 | Beaman et al. |
| 2008/0129320 A1 | 6/2008 | Beaman et al. |
| 2008/0132094 A1 | 6/2008 | Beaman et al. |
| 2008/0156518 A1 | 7/2008 | Honer et al. |
| 2008/0164595 A1 | 7/2008 | Wu et al. |
| 2008/0169548 A1 | 7/2008 | Baek |
| 2008/0211084 A1 | 9/2008 | Chow et al. |
| 2008/0230887 A1 | 9/2008 | Sun et al. |
| 2008/0277772 A1 | 11/2008 | Groenhuis et al. |
| 2008/0284001 A1 | 11/2008 | Mori et al. |
| 2008/0284045 A1 | 11/2008 | Gerber et al. |
| 2008/0303132 A1 | 12/2008 | Mohammed et al. |
| 2008/0303153 A1 | 12/2008 | Oi et al. |
| 2008/0308305 A1 | 12/2008 | Kawabe |
| 2008/0315385 A1 | 12/2008 | Gerber et al. |
| 2009/0014876 A1 | 1/2009 | Youn et al. |
| 2009/0026609 A1 | 1/2009 | Masuda |
| 2009/0032913 A1 | 2/2009 | Haba |
| 2009/0039523 A1 | 2/2009 | Jiang et al. |
| 2009/0045497 A1 | 2/2009 | Kagaya et al. |
| 2009/0050994 A1 | 2/2009 | Ishihara et al. |
| 2009/0079094 A1 | 3/2009 | Lin |
| 2009/0085185 A1 | 4/2009 | Byun et al. |
| 2009/0085205 A1 | 4/2009 | Sugizaki |
| 2009/0091009 A1 | 4/2009 | Corisis et al. |
| 2009/0091022 A1 | 4/2009 | Meyer et al. |
| 2009/0102063 A1 | 4/2009 | Lee et al. |
| 2009/0104736 A1 | 4/2009 | Haba et al. |
| 2009/0115044 A1 | 5/2009 | Hoshino et al. |
| 2009/0121351 A1 | 5/2009 | Endo |
| 2009/0127686 A1 | 5/2009 | Yang et al. |
| 2009/0128176 A1 | 5/2009 | Beaman et al. |
| 2009/0140415 A1 | 6/2009 | Furuta |
| 2009/0146301 A1 | 6/2009 | Shimizu et al. |
| 2009/0146303 A1 | 6/2009 | Kwon |
| 2009/0160065 A1 | 6/2009 | Haba et al. |
| 2009/0189288 A1 | 7/2009 | Beaman et al. |
| 2009/0206461 A1 | 8/2009 | Yoon |
| 2009/0212418 A1 | 8/2009 | Gurrum et al. |
| 2009/0212442 A1 | 8/2009 | Chow et al. |
| 2009/0236700 A1 | 9/2009 | Moriya |
| 2009/0236753 A1 | 9/2009 | Moon et al. |
| 2009/0239336 A1 | 9/2009 | Lee et al. |
| 2009/0256229 A1 | 10/2009 | Ishikawa et al. |
| 2009/0260228 A1 | 10/2009 | Val |
| 2009/0261466 A1 | 10/2009 | Pagaila et al. |
| 2009/0302445 A1 | 12/2009 | Pagaila et al. |
| 2009/0315579 A1 | 12/2009 | Beaman et al. |
| 2009/0316378 A1 | 12/2009 | Haba et al. |
| 2010/0000775 A1 | 1/2010 | Shen et al. |
| 2010/0003822 A1 | 1/2010 | Miyata et al. |
| 2010/0006963 A1 | 1/2010 | Brady |
| 2010/0007009 A1 | 1/2010 | Chang et al. |
| 2010/0007026 A1 | 1/2010 | Shikano |
| 2010/0025835 A1 | 2/2010 | Oh et al. |
| 2010/0032822 A1 | 2/2010 | Liao et al. |
| 2010/0044860 A1 | 2/2010 | Haba et al. |
| 2010/0052135 A1 | 3/2010 | Shim et al. |
| 2010/0052187 A1 | 3/2010 | Lee et al. |
| 2010/0078789 A1 | 4/2010 | Choi et al. |
| 2010/0078795 A1 | 4/2010 | Dekker et al. |
| 2010/0087035 A1 | 4/2010 | Yoo et al. |
| 2010/0090330 A1 | 4/2010 | Nakazato |
| 2010/0109138 A1 | 5/2010 | Cho |
| 2010/0117212 A1 | 5/2010 | Corisis et al. |
| 2010/0133675 A1 | 6/2010 | Yu et al. |
| 2010/0148360 A1 | 6/2010 | Lin et al. |
| 2010/0148374 A1 | 6/2010 | Castro |
| 2010/0171205 A1 | 7/2010 | Chen et al. |
| 2010/0193937 A1 | 8/2010 | Nagamatsu et al. |
| 2010/0200981 A1 | 8/2010 | Huang et al. |
| 2010/0213560 A1 | 8/2010 | Wang et al. |
| 2010/0224975 A1 | 9/2010 | Shin et al. |
| 2010/0232129 A1 | 9/2010 | Haba et al. |
| 2010/0237471 A1 | 9/2010 | Pagaila et al. |
| 2010/0246141 A1 | 9/2010 | Leung et al. |
| 2010/0289142 A1 | 11/2010 | Shim et al. |
| 2010/0314748 A1 | 12/2010 | Hsu et al. |
| 2010/0320585 A1 | 12/2010 | Jiang et al. |
| 2010/0327419 A1 | 12/2010 | Muthukumar et al. |
| 2011/0057308 A1 | 3/2011 | Choi et al. |
| 2011/0068453 A1 | 3/2011 | Cho et al. |
| 2011/0115081 A1 | 5/2011 | Osumi |
| 2011/0140259 A1 | 6/2011 | Cho et al. |
| 2011/0147911 A1 | 6/2011 | Kohl et al. |
| 2011/0175213 A1 | 7/2011 | Mori et al. |
| 2011/0220395 A1 | 9/2011 | Cho et al. |
| 2011/0223721 A1 | 9/2011 | Cho et al. |
| 2011/0237027 A1 | 9/2011 | Kim et al. |
| 2011/0241192 A1 | 10/2011 | Ding et al. |
| 2011/0241193 A1 | 10/2011 | Ding et al. |
| 2011/0272449 A1 | 11/2011 | Pirkle et al. |
| 2011/0272798 A1 | 11/2011 | Lee et al. |
| 2012/0007232 A1 | 1/2012 | Haba |
| 2012/0015481 A1 | 1/2012 | Kim |
| 2012/0018885 A1 | 1/2012 | Lee et al. |
| 2012/0020026 A1 | 1/2012 | Oganesian et al. |
| 2012/0025365 A1 | 2/2012 | Haba |
| 2012/0034777 A1 | 2/2012 | Pagaila et al. |
| 2012/0043655 A1 | 2/2012 | Khor et al. |
| 2012/0056312 A1 | 3/2012 | Pagaila et al. |
| 2012/0061814 A1 | 3/2012 | Camacho et al. |
| 2012/0063090 A1 | 3/2012 | Hsiao et al. |
| 2012/0080787 A1 | 4/2012 | Shah et al. |
| 2012/0086111 A1 | 4/2012 | Iwamoto et al. |
| 2012/0086130 A1 | 4/2012 | Sasaki et al. |
| 2012/0104595 A1 | 5/2012 | Haba et al. |
| 2012/0104624 A1 | 5/2012 | Choi et al. |
| 2012/0119380 A1 | 5/2012 | Haba |
| 2012/0145442 A1 | 6/2012 | Gupta et al. |
| 2012/0146235 A1 | 6/2012 | Choi et al. |
| 2012/0184116 A1 | 7/2012 | Pawlikowski et al. |
| 2012/0280374 A1 | 11/2012 | Choi et al. |
| 2012/0280386 A1 | 11/2012 | Sato et al. |
| 2012/0326337 A1 | 12/2012 | Camacho et al. |
| 2013/0032944 A1 | 2/2013 | Sato et al. |
| 2013/0037802 A1 | 2/2013 | England et al. |
| 2013/0049218 A1 | 2/2013 | Gong et al. |
| 2013/0049221 A1 | 2/2013 | Han et al. |
| 2013/0069222 A1 | 3/2013 | Camacho |
| 2013/0082399 A1 | 4/2013 | Kim et al. |
| 2013/0093087 A1 | 4/2013 | Chau et al. |
| 2013/0093088 A1 | 4/2013 | Chau et al. |
| 2013/0095610 A1 | 4/2013 | Chau et al. |
| 2013/0105979 A1 | 5/2013 | Yu et al. |
| 2013/0134588 A1 | 5/2013 | Yu et al. |
| 2013/0182402 A1 | 7/2013 | Chen et al. |
| 2013/0200533 A1 | 8/2013 | Chau et al. |
| 2013/0234317 A1 | 9/2013 | Chen et al. |

(56) References Cited

U.S. PATENT DOCUMENTS

| | | |
|---|---|---|
| 2013/0241083 A1 | 9/2013 | Yu et al. |
| 2014/0021605 A1 | 1/2014 | Yu et al. |
| 2014/0036454 A1 | 2/2014 | Caskey et al. |
| 2014/0124949 A1 | 5/2014 | Paek et al. |
| 2014/0220744 A1 | 8/2014 | Damberg et al. |
| 2014/0264945 A1 | 9/2014 | Yap et al. |
| 2015/0017765 A1 | 1/2015 | Co et al. |
| 2015/0044823 A1 | 2/2015 | Mohammed |

FOREIGN PATENT DOCUMENTS

| | | |
|---|---|---|
| CN | 1877824 A | 12/2006 |
| CN | 101409241 A | 4/2009 |
| CN | 101449375 A | 6/2009 |
| CN | 101675516 A | 3/2010 |
| CN | 101819959 A | 9/2010 |
| CN | 102324418 A | 1/2012 |
| EP | 920058 | 6/1999 |
| EP | 1449414 A1 | 8/2004 |
| EP | 2234158 A1 | 9/2010 |
| JP | S51-050661 | 5/1976 |
| JP | 59189069 | 10/1984 |
| JP | 61125062 A | 6/1986 |
| JP | S62158338 A | 7/1987 |
| JP | 62226307 | 10/1987 |
| JP | 1012769 A | 1/1989 |
| JP | 6471162 | 3/1989 |
| JP | H04346436 A | 12/1992 |
| JP | 06268015 A | 9/1994 |
| JP | H06333931 A | 12/1994 |
| JP | 07122787 A | 5/1995 |
| JP | 09505439 | 5/1997 |
| JP | H1065054 A | 3/1998 |
| JP | H10135220 A | 5/1998 |
| JP | H10135221 A | 5/1998 |
| JP | 1118364 | 1/1999 |
| JP | 11074295 A | 3/1999 |
| JP | 11135663 A | 5/1999 |
| JP | H11145323 A | 5/1999 |
| JP | 11251350 A | 9/1999 |
| JP | H11260856 A | 9/1999 |
| JP | 11317476 | 11/1999 |
| JP | 2000323516 A | 11/2000 |
| JP | 2001196407 A | 7/2001 |
| JP | 2001326236 A | 11/2001 |
| JP | 2002289769 A | 10/2002 |
| JP | 2003122611 A | 4/2003 |
| JP | 2003174124 A | 6/2003 |
| JP | 2003307897 A | 10/2003 |
| JP | 2004031754 A | 1/2004 |
| JP | 200447702 | 2/2004 |
| JP | 2004172157 A | 6/2004 |
| JP | 2004281514 A | 10/2004 |
| JP | 2004319892 A | 11/2004 |
| JP | 2004327855 A | 11/2004 |
| JP | 2004327856 A | 11/2004 |
| JP | 2004343030 A | 12/2004 |
| JP | 2005011874 A | 1/2005 |
| JP | 2005033141 A | 2/2005 |
| JP | 2003377641 A | 6/2005 |
| JP | 2005142378 A | 6/2005 |
| JP | 2005175019 A | 6/2005 |
| JP | 2003426392 A | 7/2005 |
| JP | 2005183880 A | 7/2005 |
| JP | 2005183923 A | 7/2005 |
| JP | 2005203497 A | 7/2005 |
| JP | 2005302765 A | 10/2005 |
| JP | 2006108588 A | 4/2006 |
| JP | 2006186086 A | 7/2006 |
| JP | 2006344917 | 12/2006 |
| JP | 2007123595 A | 5/2007 |
| JP | 2007208159 A | 8/2007 |
| JP | 2007234845 A | 9/2007 |
| JP | 2007287922 A | 11/2007 |
| JP | 2007335464 | 12/2007 |
| JP | 200834534 A | 2/2008 |
| JP | 2008166439 A | 7/2008 |
| JP | 2008171938 A | 7/2008 |
| JP | 2008251794 A | 10/2008 |
| JP | 2008277362 A | 11/2008 |
| JP | 2008306128 A | 12/2008 |
| JP | 2009004650 A | 1/2009 |
| JP | 2009044110 A | 2/2009 |
| JP | 2009506553 | 2/2009 |
| JP | 2009508324 A | 2/2009 |
| JP | 2009064966 A | 3/2009 |
| JP | 2009088254 A | 4/2009 |
| JP | 2009111384 A | 5/2009 |
| JP | 2009528706 A | 8/2009 |
| JP | 2009260132 A | 11/2009 |
| JP | 2010103129 A | 5/2010 |
| JP | 2010192928 A | 9/2010 |
| JP | 2010199528 A | 9/2010 |
| JP | 2010206007 A | 9/2010 |
| JP | 2011514015 A | 4/2011 |
| KR | 100265563 | 9/2000 |
| KR | 20010061849 A | 7/2001 |
| KR | 2001-0094894 A | 11/2001 |
| KR | 100393102 | 7/2002 |
| KR | 20020058216 A | 7/2002 |
| KR | 20060064291 A | 6/2006 |
| KR | 20080020069 A | 3/2008 |
| KR | 100865125 B1 | 10/2008 |
| KR | 20080094251 A | 10/2008 |
| KR | 100886100 B1 | 2/2009 |
| KR | 20090033605 A | 4/2009 |
| KR | 20090123680 A | 12/2009 |
| KR | 20100033012 A | 3/2010 |
| KR | 20100062315 A | 6/2010 |
| KR | 101011863 B1 | 1/2011 |
| KR | 20120075855 A | 7/2012 |
| KR | 20150012285 A | 2/2015 |
| TW | 200539406 A | 12/2005 |
| TW | 200810079 A | 2/2008 |
| TW | 200849551 A | 12/2008 |
| TW | 200933760 A | 8/2009 |
| TW | 201023277 A | 6/2010 |
| TW | 201250979 A | 12/2012 |
| WO | 02/13256 A1 | 2/2002 |
| WO | 03045123 A1 | 5/2003 |
| WO | 2004077525 A2 | 9/2004 |
| WO | 2006050691 A2 | 5/2006 |
| WO | 2007101251 A2 | 9/2007 |
| WO | 2008065896 A1 | 6/2008 |
| WO | 2008120755 A1 | 10/2008 |
| WO | 2009096950 A1 | 8/2009 |
| WO | 2009158098 A2 | 12/2009 |
| WO | 2010041630 A1 | 4/2010 |
| WO | 2010101163 A1 | 9/2010 |
| WO | 2013059181 A1 | 4/2013 |
| WO | 2013065895 A1 | 5/2013 |
| WO | 2014107301 A1 | 7/2014 |

OTHER PUBLICATIONS

North Corporation, "Processed Intra-layer Interconnection Material for PWBs [Etched Copper Bump with Copper Foil]," NMBITM, Version 2001.6.

Kim et al., "Application of Through Mold Via (TMV) as PoP base package", 6 pages (2008).

International Search Report, PCT/US2005/039716, dated Apr. 5, 2006.

International Search Report Application No. PCT/US2011/024143, dated Sep. 14, 2011.

Korean Search Report KR10-2011-0041843 dated Feb. 24, 2011.

International Search Report and Written Opinion PCT/US2011/044342 dated May 7, 2012.

Bang, U.S. Appl. No. 10/656,534, filed Sep. 5, 2001.

International Search Report and Written Opinion for Application No. PCT/U52011/044346 dated May 11, 2012.

Partial International Search Report from Invitation to Pay Additional Fees for Application No. PCT/US2012/028738 dated Jun. 6, 2012.

(56) References Cited

OTHER PUBLICATIONS

Korean Office Action for Application No. 10-2011-0041843 dated Jun. 20, 2011.
"EE Times Asia" [online]. [Retrieved Aug. 5, 2010]. Retrieved from internet. <http://www.eetasia.com/ART_8800428222_480300_nt_dec52276.HTM>, 4 pages.
Redistributed Chip Package (RCP) Technology, Freescale Semiconductor, 2005, 6 pages.
"Wafer Level Stack—WDoD", [online]. [Retrieved Aug. 5, 2010]. Retrieved from the internet. <http://www.3d-plus.com/techno-wafer-level-stack-wdod.php>, 2 pages.
Jin, Yonggang et al., "STM 3D-IC Package and 3D eWLB Development," STMicroelectronics Singapore/STMicroelectronics France May 21, 2010.
Yoon, PhD, Seung Wook, "Next Generation Wafer Level Packaging Solution for 3D integration," May 2010, STATS ChipPAC Ltd.
Search Report from Korean Patent Applicatin No. 10-2010-0113271 dated Jan. 12, 2011.
International Search Report and Written Opinion for PCT/US2011/060551 dated Apr. 18, 2012.
Meiser S, "Klein Und Komplex", Elektronik, IRL Press Limited, DE, vol. 41, No. 1, Jan. 7, 1992 (Jan. 7, 1992), pp. 72-77, XP000277326. (International Search Report for Application No. PCT/US2012/060402 dated Feb. 21, 2013 provides concise statement of relevance.).
Partial International Search Report for Application No. PCT/US2012/060402 dated Feb. 21, 2013.
International Search Report and Written Opinion for Application No. PCT/US2012/060402 dated Apr. 2, 2013.
Partial International Search Report for Application No. PCT/U52013/026126 dated Jun. 17, 2013.
International Search Report and Written Opinion for Application No. PCT/US2013/026126 dated Jul. 25, 2013.
Extended European Search Report for Application No. EP13162975 dated Sep. 5, 2013.
International Search Report and Written Opinion for Application No. PCT/U52013/052883 dated Oct. 21, 2013.
Japanese Office Action for Application No. 2013-509325 dated Oct. 18, 2013.
Office Action from U.S. Appl. No. 12/769,930 dated May 5, 2011.
International Search Report and Written Opinion for Application No. PCT/US2013/053437 dated Nov. 25, 2013.
International Search Report and Written Opinion for Application No. PCT/US2013/041981 dated Nov. 13, 2013.
Office Action for Taiwan Application No. 100125521 dated Dec. 20, 2013.
Office Action from Taiwan for Application No. 100125522 dated Jan. 27, 2014.
Partial International Search Report for Application No. PCT/US2013/075672 dated Mar. 12, 2014.
Taiwanese Office Action for Application No. 100141695 dated Mar. 19, 2014.
International Search Report and Written Opinion for Application No. PCT/US2013/075672 dated Apr. 22, 2014.
Taiwanese Office Action for Application No. 101138311 dated Jun. 27, 2014.
Chinese Office Action for Application No. 201180022247.8 dated Sep. 16, 2014.
International Search Report and Written Opinion for Application No. PCT/US2011/024143 dated Jan. 17, 2012.
Taiwanese Office Action for Application No. 100140428 dated Jan. 26, 2015.
Korean Office Action for Application No. 2014-7025992 dated Feb. 5, 2015.
Japanese Office Action for Application No. 2013-520776 dated Apr. 21, 2015.
International Search Report and Written Opinion for Application No. PCT/US2015/011715 dated Apr. 20, 2015.
Chinese Office Action for Application No. 201180022247.8 dated Apr. 14, 2015.
Japanese Office Action for Application No. 2013-520777 dated May 22, 2015.
Chinese Office Action for Application No. 201310264264.3 dated May 12, 2015.
Partial International Search Report for Application No. PCT/US2015/033004 dated Sep. 9, 2015.
Taiwanese Office Action for Application No. 102106326 dated Sep. 18, 2015.
U.S. Appl. No. 13/477,532, filed May 22, 2012.
International Search Report and Written Opinion for Application No. PCT/US2014/050125 dated Feb. 4, 2015.
Written Opinion for Application No. PCT/US2014/050125 dated Jul. 15, 2015.
Partial International Search Report for Application No. PCT/US2014/014181 dated May 8, 2014.
International Search Report and Written Opinion for Application No. PCT/US2014/014181 dated Jun. 13, 2014.
Taiwanese Office Action for Application No. 103103350 dated Mar. 21, 2016.
International Search Report and Written Opinion for Application No. PCT/U52014/050148 dated Feb. 9, 2015.
International Search Report and Written Opinion for Application No. PCT/US2014/055695 dated Mar. 20, 2015.
International Preliminary Report on Patentability, Chapter II, for Application No. PCT/US2014/055695 dated Dec. 15, 2015.

FINE PITCH BVA USING RECONSTITUTED WAFER WITH AREA ARRAY ACCESSIBLE FOR TESTING

CROSS-REFERENCE TO RELATED APPLICATION

This application is a continuation of U.S. application Ser. No. 14/157,790, filed on Jan. 17, 2014, the disclosure of which is incorporated herein by reference.

FIELD OF THE INVENTION

The present technology relates to structures for microelectronic packaging.

BACKGROUND OF THE INVENTION

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent to each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or another bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm and about 0.8 mm (5 and 30 mils) in diameter, attached to the terminals of the package.

A package having an array of solder balls projecting from its bottom surface is commonly referred to as a ball grid array or "BGA" package. Other packages, referred to as land grid array or "LGA" packages, are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

Packaged semiconductor chips are often provided in "stacked" arrangements, wherein one package is provided, for example, on a circuit board, and another package is mounted on top of the first package. These arrangements can allow a number of different chips to be mounted within a single footprint on a circuit board and can further facilitate high-speed operation by providing a short interconnection between packages. Often, this interconnect distance is only slightly larger than the thickness of the chip itself. For interconnection to be achieved within a stack of chip packages, it is necessary to provide structures for mechanical and electrical connection on both sides of each package (except for the topmost package). This has been done, for example, by providing contact pads or lands on both sides of the substrate to which the chip is mounted, the pads being connected through the substrate by conductive vias or the like. Solder balls or the like have been used to bridge the gap between the contacts on the top of a lower substrate to the contacts on the bottom of the next higher substrate. The solder balls must be higher than the height of the chip in order to connect the contacts. Examples of stacked chip arrangements and interconnect structures are provided in U.S. Patent App. Pub. No. 2010/0232129 ("the '129 Publication"), the disclosure of which is incorporated by reference herein in its entirety.

Despite all of the above-described advances in the art, further improvements in making and testing microelectronic units would be desirable.

BRIEF SUMMARY OF THE INVENTION

A microelectronic package has a first side, a second side, a microelectronic element and an encapsulation which may overly the sidewalls of the microelectronic element. The microelectronic package may have a plurality of electrically conductive elements at its front face, which may be at the first side of the package for connection with a component external to the microelectronic package. The microelectronic package can have electrically conductive connector elements which may have ends adjacent either the first or second side of the package. The connector elements may be contacted by the encapsulation between their first and second ends and may be configured for electrically coupling a first external component below the first side with a second external component above the second side.

A method for simultaneously making a plurality of microelectronic packages. The method may include the steps of: forming an electrically conductive redistribution structure on a carrier and providing a plurality of microelectronic element attachment regions, which may be spaced apart from one another in at least a first direction parallel with a surface of the carrier. The method may include forming multiple electrically conductive connector elements between adjacent attachment regions. Each connector element may have a first end, a second end and edge surfaces, the first end may be adjacent the carrier and the second end may be at a height greater than 50 microns above the carrier. The method may also include forming a dielectric encapsulation over portions of the edge surfaces of the connector elements and subsequently singulating the assembly into a plurality of microelectronic units. Each of the microelectronic units may include one or more microelectronic elements, either stacked upon one another or side by side. The surface of the microelectronic unit, opposite the redistribution structure, may have the front face of the microelectronic element and the second ends of the connector elements available for connection with a component external to the microelectronic unit.

A method for simultaneously making a plurality of microelectronic packages. The method may include the steps of: providing a carrier with a plurality of microelectronic element attachment regions spaced apart from one another. Then forming a plurality of electrically conductive connector elements, which may lie between adjacent attachment regions. Each connector element may have a first end, a second end and edge surfaces. The first end of each connector element can be adjacent the carrier and the second end of each connector element can be at a height greater than 50 microns above the carrier. The method may also include attaching a plurality of microelectronic elements to respective attachment regions on the carrier. Each microelectronic element having a front face, a rear face and sidewalls, the front face having contacts. The front face may face the carrier. The method can include forming a dielectric encapsulation over at least portions of the edge surfaces of the connector elements. An electrically conductive redistribution structure can then be formed which overlies at least a surface of the encapsulation opposite from the front faces of the microelectronic element. The redistribution structure can be coupled to the second ends of the connector elements, and may have traces extending in a first or lateral direction. Singulation typically is performed into a plurality of microelectronic units each including a microelectronic element. In each resulting microelectronic unit, a first face of the microelectronic element and first ends of the connector elements can be available for connection with a component external to the microelectronic unit.

DETAILED DESCRIPTION

Figure 1A:
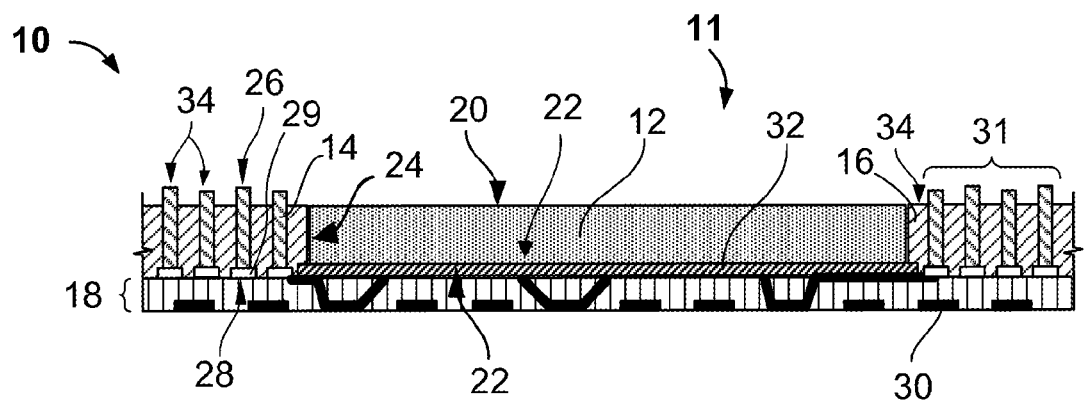
FIG. 1A is sectional view depicting a microelectronic unit according to an embodiment of the invention.
Figure 1B:
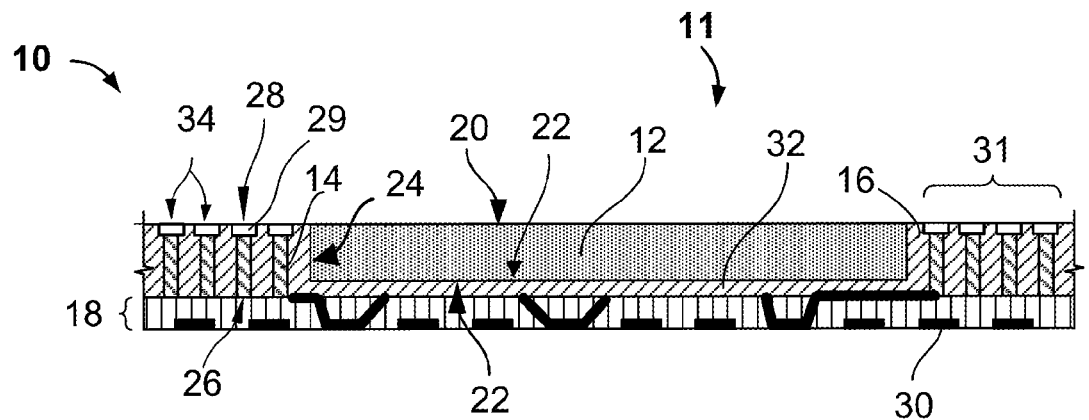
FIG. 1B is a sectional view depicting a microelectronic unit according to a variation of the embodiment shown in FIG. 1A.
Figure 2:
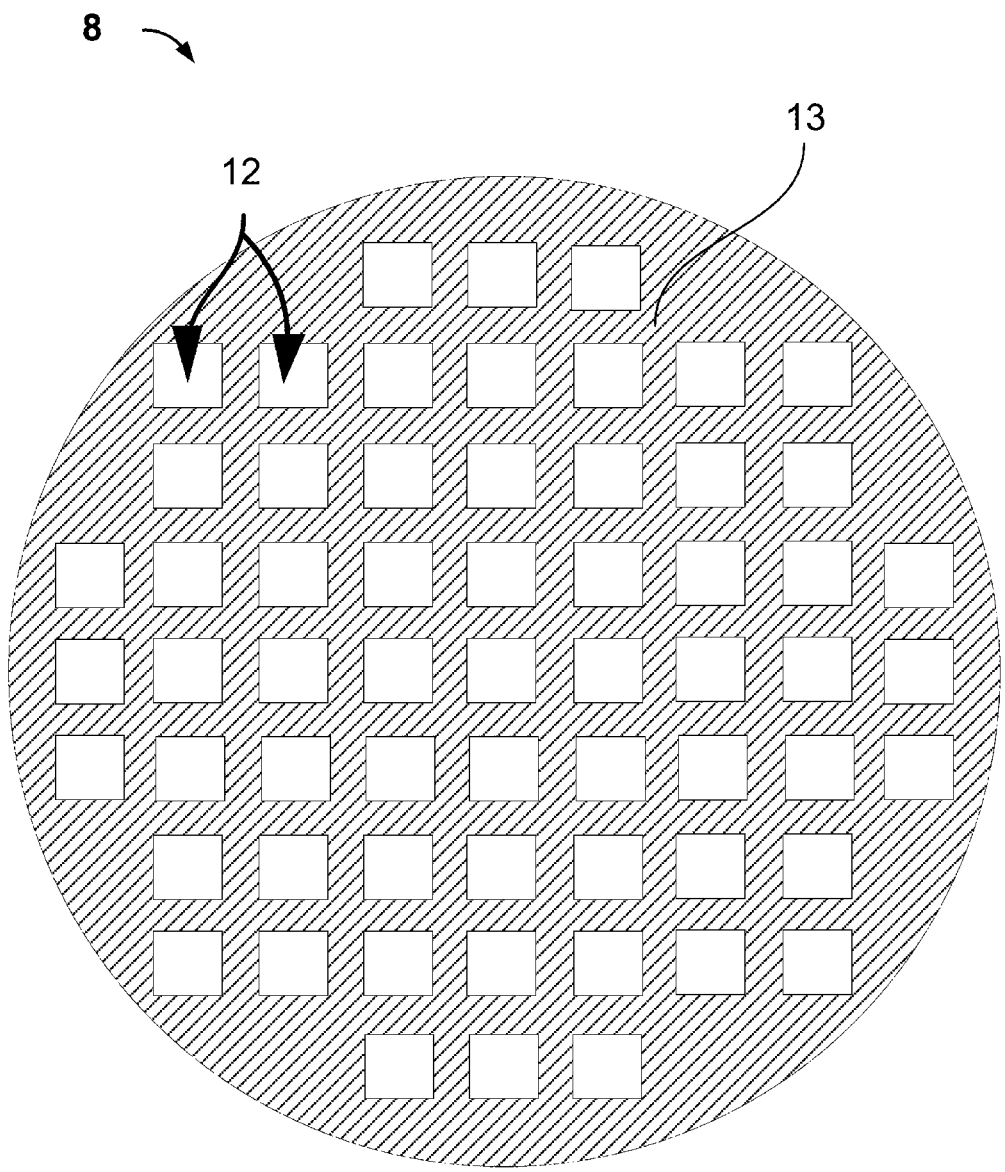
FIG. 2 shows a top plan view of an example reconstituted assembly.

The processes described herein can be used to form the example microelectronic units or packages seen in FIGS. 1A and 1B. As seen in FIGS. 1A and 1B there are example substrate-less packages 10 that may include microelectronic element 12 (as seen in FIG. 2), connector elements 14, encapsulant 16 and redistribution structure 18. The microelectronic element 12 may have a front face 20 or "active face," a rear face 22, and sidewalls 24 extending between the front and rear faces. The front face 20 may be at a first side 11 of the microelectronic unit or package 10. As used in this disclosure with reference to a component, e.g., connector element, first end, second end, free end, conductive element, microelectronic element, etc., a statement that an element is "at" a surface of a component indicates that, when the component is not assembled with any other element, the electrically conductive element is available for contact with a theoretical point moving in a direction perpendicular to the surface of the component toward the surface of the component from outside the component. Thus, a terminal or other conductive element which is at a surface of a microelectronic unit 12 may project from such surface; may be flush with such surface; or may be recessed relative to such surface in a hole or depression in the substrate.

Figure 10:
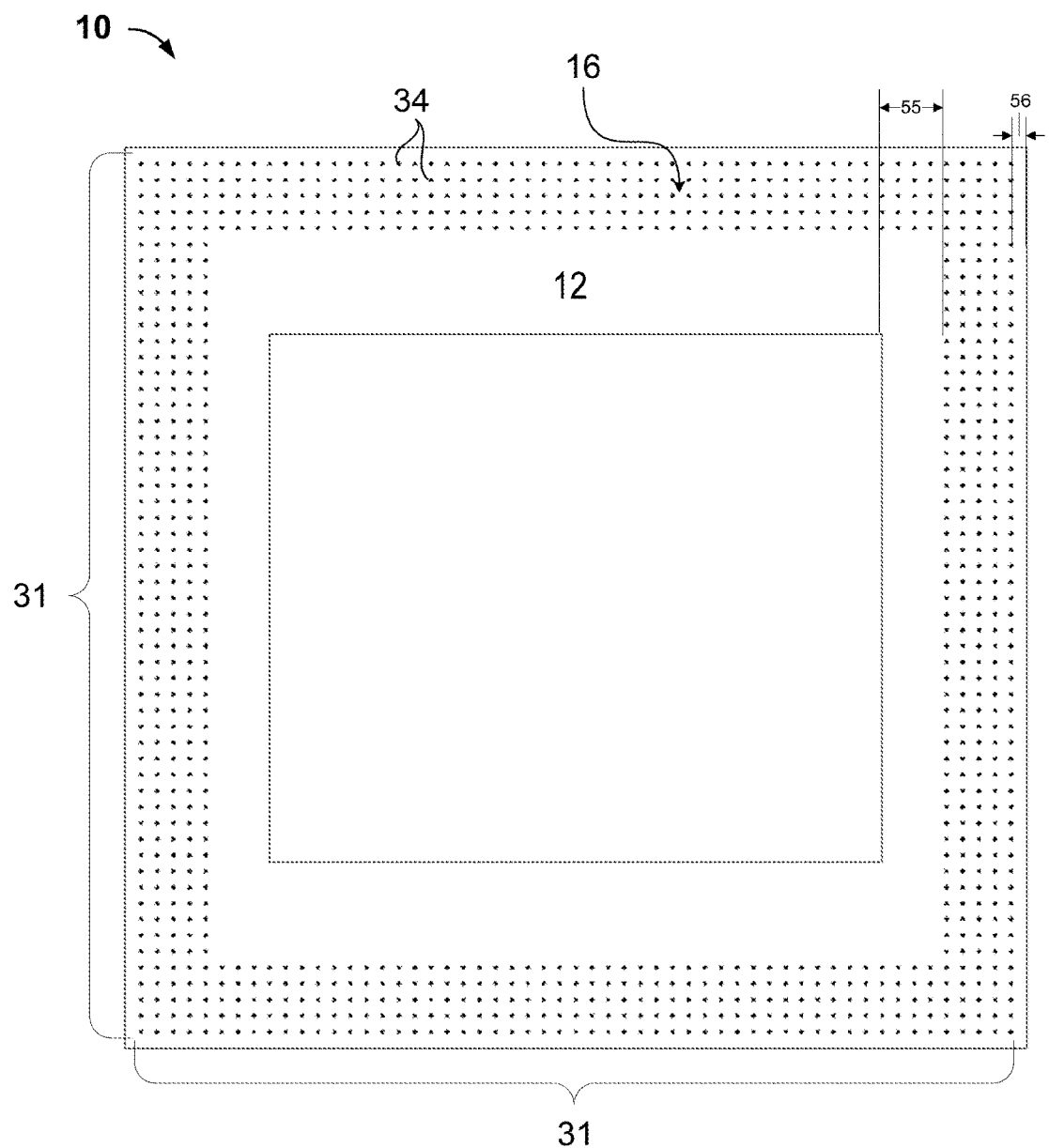
FIG. 10 is a top elevation view illustrating a microelectronic unit according to an embodiment of the invention.

Connector elements 14 may include first ends 28 (e.g., bases), second ends 26 (e.g., tips) and edges extending vertically between the first and second ends. The first ends 28 may comprise conductive elements 29 (e.g., pads) made of copper, nickel, aluminum, tin, palladium or other similar conductive material or combination of conductive materials. Connector elements 14 may be arranged in a pattern to form area array 31, which may surround microelectronic element 12 and have a grid-like appearance, such as further seen in a corresponding plan view thereof in FIG. 10. Area array 31 may be filled in with encapsulant 16 such that the free ends 34 of connector elements 14 are at the surface of the encapsulant 16. As seen in FIG. 10 the free ends 34 of the connector elements may be arranged into a grid or an array and exposed at the surface of the dielectric encapsulation 16. The free ends 34 of the connector elements 14 can be characterized as being "free" in that they are not electrically connected or otherwise joined to other electrically conductive features within microelectronic unit 12 that are proximate to the free ends 34. In other words, free ends 34 are available for electronic connection, either directly or indirectly to a conductive feature external to the microelectronic unit 12. The fact that free ends 34 held in a predetermined position by, for example, encapsulation 16 or otherwise joined or electrically connected to another conductive feature does not mean that they are not "free" as described herein, so long as any such feature is not proximate to the free end. As seen above, depending on the configuration either the first end or the second end may be the free end, for example in FIG. 1A the second ends 26 (e.g., tips) are the free ends, whereas in FIG. 1B the first ends (e.g., bases) are the free ends 34. In either situation, the free ends 34 and the front face of the microelectronic element 12 may be at the same side of the package and remote from redistribution structure 18. Conversely, the ends of the connector elements that are adjacent the redistribution structure 18 may not be free ends because they are directly or indirectly electrically coupled to the redistribution structure 18.

As seen in FIG. 10, there is an exemplary pattern of the connector elements' free ends 34 forming area array 31. In one example, area array 31 may have a plurality of rows and columns that surround the microelectronic element 12 along the perimeter portion of the microelectronic unit 12. The area array 31 may extend beyond the edge of the microelectronic element toward the edge of the microelectronic unit 10. The area array 31 may be arranged such that there are no connector elements 14 within distance 55 (e.g., less than 4 mm) extending outward from the edge of the microelectronic element 12. The area array 31 may also be arranged such that the connector elements 14 are subset a small distance 56 (e.g., less than 4 mm) inward from the package edge. In One example there may be no connector elements within 0.5 mm of the edge of the microelectronic element 12 and 0.5 mm of the edge of the microelectronic unit 10.

The quantity of connector elements 14 (e.g., I/O connections) may depend on the portion of the microelectronic unit that includes connectors as well as the density of the connector elements 14. The density relates to the thickness of each connector as well as how close the connector elements are to one another (e.g., pitch). The connector elements may have different dimensions depending on the particular structure, for example for wirebonds the thickness may be approximately 500 μm, whereas solder material may have a larger thickness. The pitch may vary from 0.05 millimeters (mm) to 4 mm and is preferably in the range of 0.1-0.6 mm. The lower the pitch the higher the density of I/O connections. In one example, a microelectronic unit with dimensions of 14 mm×14 mm may have approximately 1440 connector elements 14 by having five rows with a pitch that is approximately equal to 0.2 mm.

Referring back to FIG. 1A, in one example of the disclosure the second ends 26 (e.g., tips) of the connector elements 14 may be at the first side 11 of the microelectronic unit 12. In one embodiment, the second ends 26 may project above the surface of the encapsulant. As used herein, a statement that an electrically conductive element is disposed "above a surface" or "overlying a surface" means at a region which is in an orthogonal direction away from the surface. A statement that one element is "above" or "upward from" a reference plane means at a region in an orthogonal direction away from the reference plane. Movement of an element in an "upward" direction means in a direction to a greater height above a reference plane defined by the surface. Conversely, movement of an element in a "downward" direction means in a direction to a lower height above a reference plane defined by the surface. All such statements and meanings of the foregoing terms are not in a gravitational reference, but rather in the frame of reference defined by the element itself.

Each of the connector elements 14 may be electrically connected to the redistribution structure. In one embodiment, the connector elements 14 and/or the redistribution structure 18 may be free of electrical connections with the microelectronic element 12. The rear face of microelectronic element 12 may be attached to redistribution structure 18 at attachment region 32, which may be covered by an adhesive layer or adhesive film. The attachment region 32 may be located in the center portion of each microelectronic unit. The redistribution structure 18 may be electrically coupled to or in direct contact with the first ends 28 (e.g., bases) of connector elements 14. In one example, the bases may be conductive pads.

As seen in FIG. 1B, in another example microelectronic unit, the connector elements' first ends 28, as opposed to second ends 26, may be at the first side 11 of the microelectronic unit and adjacent active face 20 of microelectronic element 12. The second ends 26 (e.g., bases) may be in direct physical and/or electrical contact with the redistribution structure 18. The redistribution structure 18 may be separated from the microelectronic element by encapsulation 16, which may completely cover microelectronic element 12 and surround the rear face and all the sidewalls.

The microelectronic units discussed above as well as other variations may be formed according to various stages of formation seen in FIGS. 2-9. In some examples, the redistribution structure 18 may be formed prior to the connector elements 14 and be electrically coupled to or in contact with the first ends 28 (e.g., bases), in another example, the redistribution structure 18 may be formed after the connector elements 14 and contact the second ends 26 (e.g., tips).

Referring to FIG. 2, the method of fabrication may utilize a reconstituted assembly approach (e.g., reconstituted wafer). A reconstituted assembly 8 may be formed by placing a plurality of singulated microelectronic elements 12 onto carrier 13 for further processing. Carrier 13 may be any structure (e.g., wafer) capable of mechanically supporting a plurality of microelectronic elements while being operated on. Microelectronic elements 12 may be placed directly on the carrier or may be placed on a layer(s) previously formed on the carrier. The microelectronic elements 12 may be spaced apart and attached directly or indirectly to the carrier 13 by an adhesive material or vacuum. The plurality of microelectronic elements 12 may then be processed while in form of the reconstituted wafer and then subsequently singulated to form individual packaged microelectronic units.

Figure 3:
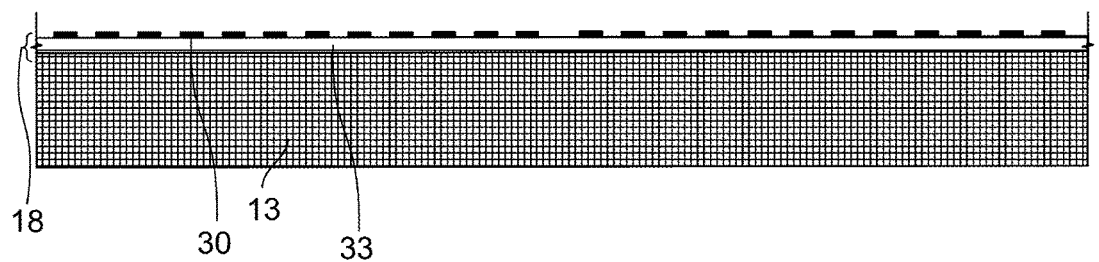
FIG. 3 illustrates a stage in a method of forming a microelectronic unit similar to FIG. 1A.

One aspect of the disclosure includes a method of processing microelectronic units by forming the redistribution structure 18 at a relatively early stage in the process, which may result in a structure similar to that seen in FIG. 1A. As seen in FIG. 3, a temporary attachment layer 33 (e.g., adhesive layer) and electrically conductive terminals 30 can be provided on a carrier 13. Temporary attachment layer 33 may be formed by depositing an adhesive material or attaching an adhesive material over the carrier 13. In one example, forming the conductive terminals 30 may be formed subtractively by patterning the conductive material to form individual conductive terminals 30. In another example, the conductive terminals can be formed by additive processing, e.g., by plating, deposition, printing, etc. The conductive terminals may include copper, aluminum, nickel or any other electrically conductive material such as, without limitation, conductive matrix material, conductive ink, conductive polymer, conductive paste, etc. In one example, terminals 30 may be in the form of conductive pads that may function as package terminals on the surface of the microelectronic unit (e.g., Ball Grid Array (BGA)).

Figure 4:
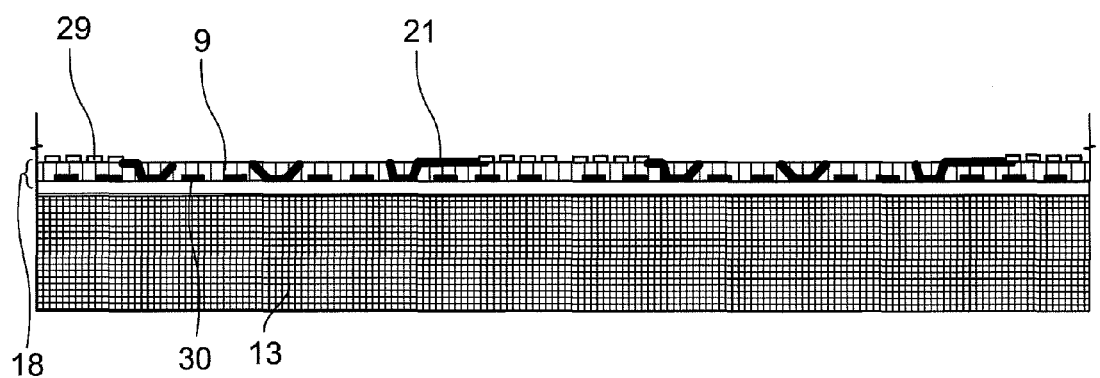
FIG. 4 further illustrates another stage in a method of forming a microelectronic unit according to FIG. 1A.

As seen in FIG. 4, redistribution structure 18 may be created on carrier 13 by forming a dielectric layer 9 and traces 21 electrically coupled with conductive terminals 30. The redistribution structure 18 may be formed by a single dielectric layer (e.g., single spin coat) or may comprise multiple dielectric layers. At a surface of the redistribution structure 18 remote from carrier 13 there may be conductive elements 29, which in one example may be formed by forming another conductive layer and subsequently patterning it to form conductive elements 29. Alternatively, the conductive elements 29 may be pads or conductive masses (e.g., solder balls) and may function as the first ends (e.g., bases) of the Bond Via Array (BVA).

Figure 5:
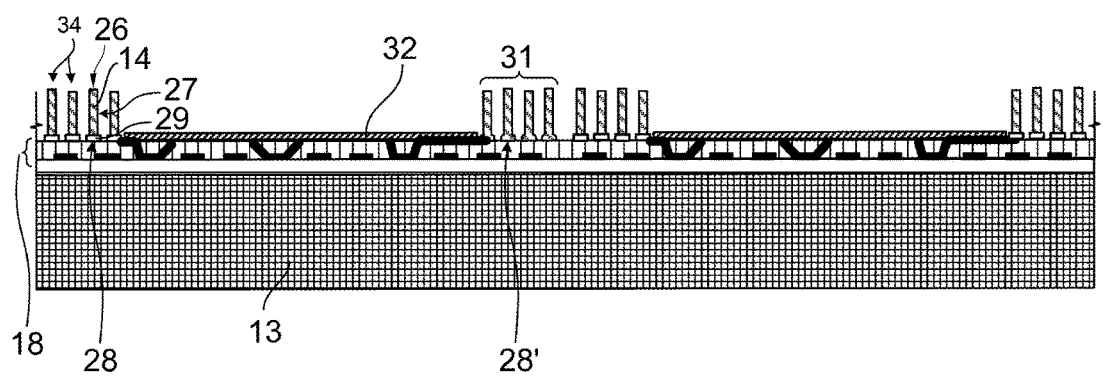
FIG. 5 further illustrates another stage in a method of forming a microelectronic unit according to FIG. 1A.

As seen in FIG. 5, the method may include forming attachment regions 32 and conductive connector elements 14. Attachment regions 32 may be positions overlying the carrier where microelectronic elements may be placed. The placement of the microelectronic elements may occur before or after forming the connector elements 14, before or after forming the encapsulation or before or after singulation. Attachment regions 32 may comprise adhesive pads and/or an adhesive film and may be formed at regions spaced apart from one another in at least a first direction parallel with the surface of the carrier.

Connector elements 14 may be formed between adjacent attachment regions 32 and may partially or fully surround each attachment region 32. Each connector element may have a first end 28, a second end 26 and an edge surface 27 extending vertically between the first and second ends. First end 28 may be adjacent and electrically coupled to redistribution structure 18 and second end 26 may be a free end remote from the redistribution structure 18. First ends 28 may overlie and be electrically coupled (e.g., bonded or joined) with conductive elements 29 and/or the first ends may comprise the conductive elements 29 and be formed integrally therewith, as seen by first ends 28'.

In one example, connector elements 14 may be wire bonds that are joined to metal bonding surfaces (e.g., conductive elements 29) using a wire bonding tool. In one example, the method for forming the wirebonds may include heating the leading end of a wire segment and pressing it against the receiving surface to which the wire segment bonds, typically forming a ball or ball-like base joined to the surface of the conductive element 29. The desired length of the wire segment needed to form the wire bond is drawn out of the bonding tool, which may then sever or cut the wire bond at the desired length.

Another technique for forming connector elements 14 may include wedge bonding or stich bonding. Wedge bonding may include dragging a portion of the a wire along the receiving surface to form a wedge that lies generally parallel to the surface. The wedge bonded wire bond can then be bent upward, if necessary, and extended to the desired length or position before cutting. In a particular embodiment, the wire used to form a wire bond can be cylindrical in cross section. Otherwise, the wire fed from the tool to form a wire bond or wedge bonded wire bond may have a polygonal cross section such as rectangular or trapezoidal, for example.

Figure 6:
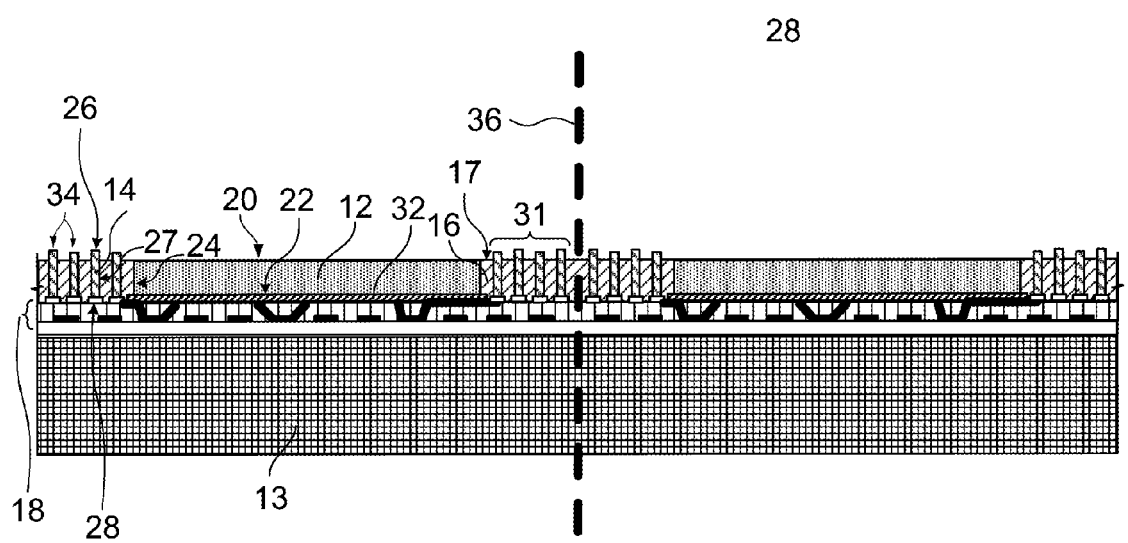
FIG. 6 further illustrates another stage in a method of forming a microelectronic unit according to FIG. 1A.

As seen in FIG. 6, microelectronic elements 12 may be placed at attachment regions 32 and surrounded by dielectric encapsulation 16. The microelectronic elements 12 may be attached before, after or during the forming of the dielectric encapsulation 16. Each microelectronic element 12 may have a front face 20, rear face 22 and sidewalls 24 extending between the front and rear faces. The front face 20 may be an active face with active or passive elements (e.g., contacts) and the rear face 22 may or may not have active or passive electrical elements (e.g., contacts). In one example, the attachment regions may be located on a surface of the redistribution structure 18 and the microelectronic elements 12 may be attached with the rear face facing toward the carrier. As such, front face 20 may be remote from and face away from the redistribution structure 18 and carrier 13.

The microelectronic elements 12 may then be surrounded by encapsulation 16 such that the encapsulation is adjacent and overlies all of the sidewalls of microelectronic element 12. During this step, the encapsulation may also be formed over portions of the connector elements edge surfaces 27 within area arrays 31. The dielectric encapsulation may have a major surface 17 that may be parallel with the front face 20 of microelectronic element 12 and at a height that is substantially aligned with the height of the microelectronic element 12 (e.g., greater than 50 mils). The surface of the encapsulation may also be at a height above, below or approximately equal to the height of the second ends 26 of connector elements 14. This may allow the second ends to project above the encapsulation 16 as seen or alternatively the second ends may be recessed or flush with the major surface 17 of the encapsulation. Following the encapsulation step there may be additional or optional processing that may occur before singulation. For example, contact elements on the front face of the microelectronic element and second ends 26 may have conductive masses (e.g., solder balls) formed on them (e.g., bumped), as seen in FIG. 11C.

After the additive and subtractive processing is completed, the resulting reconstituted assembly may include numerous microelectronic units as a continuous or semi-continuous structure such as a strip, tape or sheet. Although FIG. 6 shows no visible borders between the individual microelectronic units, they may be subsequently singulated, for example along cut line 36 and released from the carrier 13 to form individual packaged microelectronic elements, similar to the microelectronic unit seen in FIG. 1A. The microelectronic unit may be used to mechanically support and electrically connect the microelectronic element to another microelectronic structure, such as to a printed circuit board ("PCB"), or to other packaged microelectronic elements. In such a stacked arrangement, connector elements 14 can carry multiple electronic signals therethrough, each having a different signal potential to allow for different signals to be processed by different microelectronic elements in a single stack.

Figure 7:
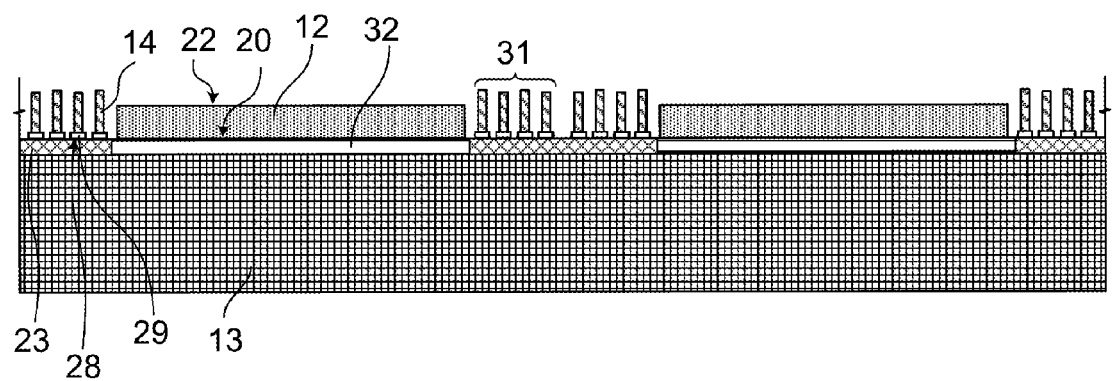
FIG. 7 illustrates a stage in a method of forming a microelectronic unit similar to FIG. 1B.
Figure 8:
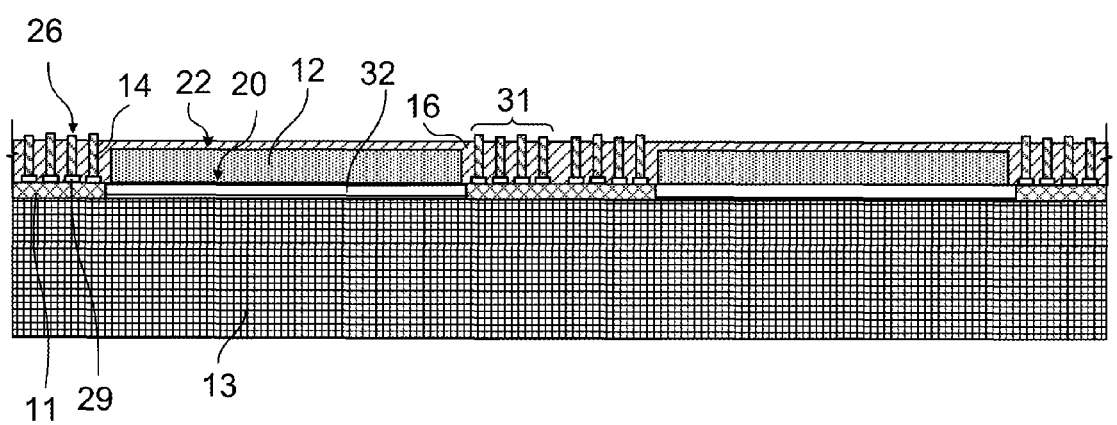
FIG. 8 further illustrates another stage in a method of forming a microelectronic unit according to FIG. 1B.

Another aspect of the disclosure includes a method of processing microelectronic units by forming the redistribution structure 18 later in the process, which may result in a structure similar to that seen in FIG. 1B. The steps and structures used in this method may include many of the same steps discussed above. As seen in FIG. 7, a carrier 13 may be used to form a reconstituted assembly (e.g., reconstituted wafer) and may include attachment regions 32, microelectronic elements 12, conductive layer 23, conductive elements 29, and connector elements 14. The attachment regions 32 may be provided directly on the carrier 13, as opposed to on the redistribution structure 18 as seen in FIG. 4. Alternatively the attachment regions 32 may be provided on an intermediate layer (e.g., conductive layer) disposed directly on carrier 13. The microelectronic elements 12, may be placed face down on the attachment regions, such that the front face is adjacent the carrier. As such, rear face 22 may be remote from or face away from the carrier. The conductive elements 29 may be formed by forming an additional conductive layer (e.g., foil) and subsequently patterning the layer to form conductive elements 29. In one example, conductive elements 29 may be in the form of pads that may function as both package terminals for the microelectronic unit and first ends (e.g., bases) of the connector elements 14. The connector elements 14 may be formed via the same process discussed above with respect to FIG. 5.

Figure 9:
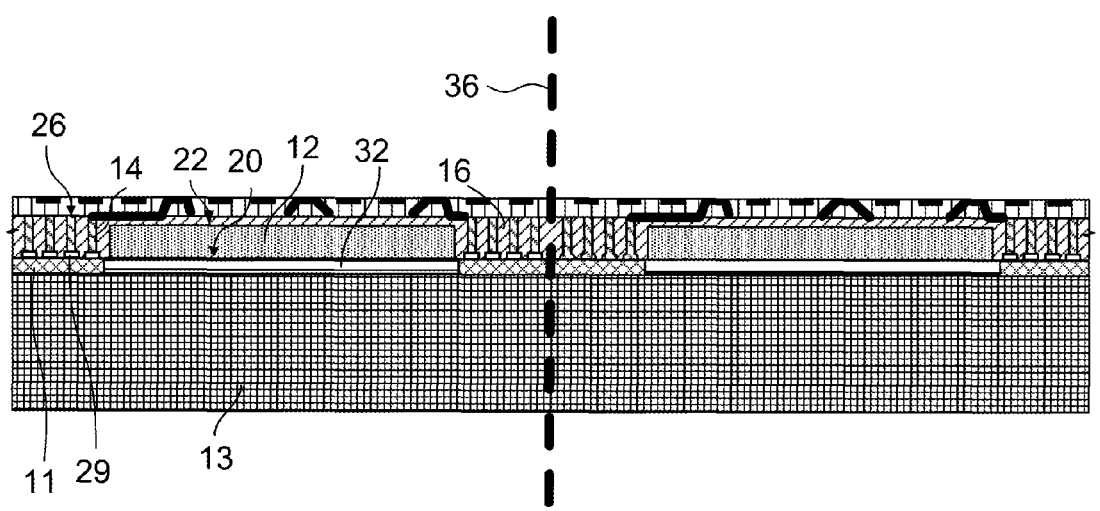
FIG. 9 further illustrates another stage in a method of forming a microelectronic unit according to FIG. 1B.

As seen in FIG. 9, the dielectric encapsulation 16 may be formed over microelectronic elements 12 and among connector elements 14 as discussed above. However, unlike in the example discussed above relative to FIGS. 3-8, the redistribution structure 18 may be formed above the encapsulation and in direct contact with the second ends of the connector elements 14. In this case, although the redistribution structure 18 may be formed using a process similar to that discussed above with respect to FIG. 4, the redistribution structure 18 may now be located remote from the carrier and may form the second side of the reconstituted assembly and the microelectronic units which will be singulated therefrom. In one example, the redistribution structure 18 is accessible (e.g., exposed) while still on the carrier, which may allow the area array to be available for electrical coupling for testing at a larger pitch.

At this point, the reconstituted assembly may be ready for singulation, however there may also be additional or optional processing that may occur before singulation. For example, conductive joining masses 35 (e.g., solder balls) may be provided at the ends of the connector elements and on contacts of the microelectronic elements, as seen in FIG. 11C. After the additive and subtractive processing is completed the reconstituted assembly may be singulated along cut line 36 (FIG. 9) and released from the carrier 13 to form individual packaged microelectronic elements, similar to the microelectronic unit seen in FIG. 1B. The microelectronic unit may then be attached to a printed circuit board, or be part of a stack of microelectronic units, as discussed above.

Figure 11A:
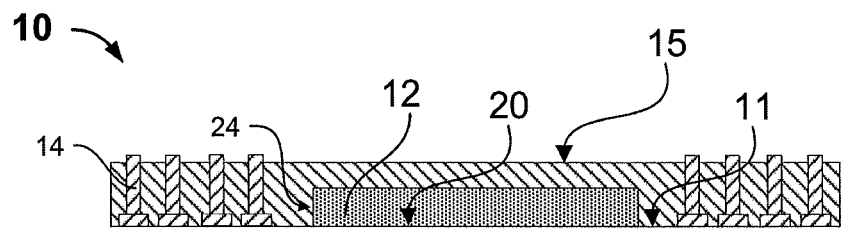
FIGS. 11A-D are sectional views depicting variations in the connector elements and encapsulation according to an embodiment of the invention.
Figure 11B:
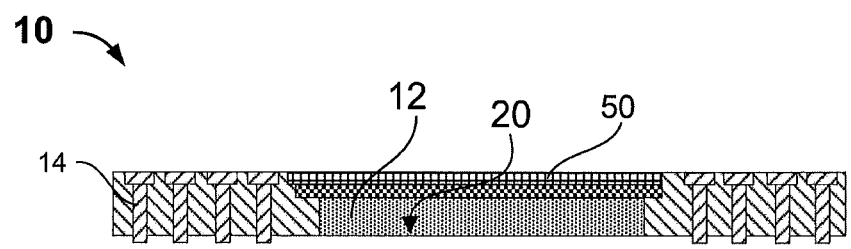
Figure 11C:
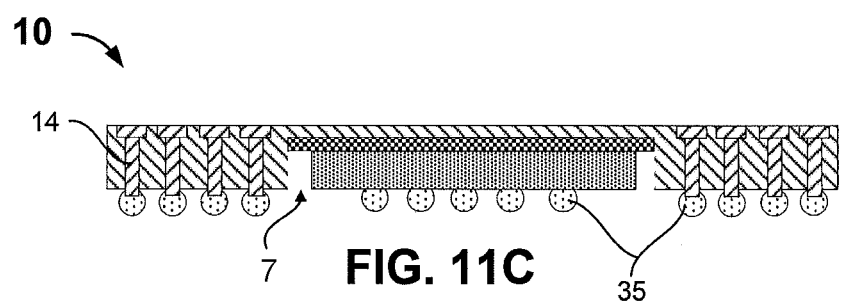

As seen in FIGS. 11A-11D, the microelectronic unit 10 may be formed without forming a redistribution structure 18 and thus the redistribution structure can be omitted from the final structure and connector elements 14 may be at both sides of the microelectronic unit. As seen in FIG. 11A, and microelectronic unit 12 may have a first side 15 (e.g., top) and a second side 15 (e.g., bottom) opposite from the first side and a microelectronic element 12. The microelectronic element 12 may have an active face 20 at a second side 15 of the microelectronic unit 10 alongside the connector elements 14. The connector elements 14 may be formed such that they extend vertically between the first and second surfaces of the microelectronic element and stand parallel with the microelectronic element's sidewalls. Each connector element may be free of electrical connections with other connector elements and/or free of electrical connections to the microelectronic element. This may allow an underlying or overlying substrate (e.g., PCB, interposer, another microelectronic package) to supply the interconnections.

Figure 11D:
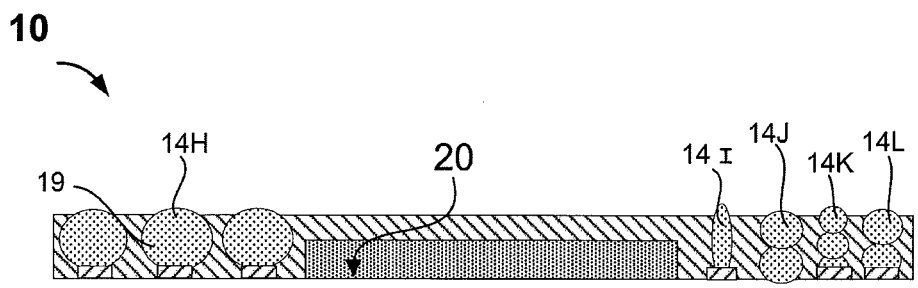

In one example, seen in FIG. 11D, the connector elements 14H and 14I may comprise a single conductive mass 19. The conductive mass may be rounded as seen in 14H or it may be elongated into an elliptical shape as seen in 14I. Each conductive mass may also include a series of stacked conductive masses, as seen in examples of connectors 14J, 14K and 14L. The conductive masses may be formed of or may include a bond metal such as tin, indium, solder, or gold. Alternatively, the conductive masses may be formed of or may comprise a curable material. In some cases, a curable material can be allowed to cure before forming additional conductive mass above it. In this case, the first and second connector ends may be the bottom and top portions respectively of a single conductive mass 19 or it may be the top and bottom conductive mass respectively when there are a plurality of conductive masses stacked.

Referring to FIG. 11B, the microelectronic unit 10 may also include a heat spreader 50 adjacent the microelectronic element 12. The heat spreader 50 may consist of or include a portion of conductive layer 23. In one example, the heat spreader 50 may be adhered directly or indirectly to the rear face of the microelectronic element 12. The heat spreader 50 may occupy a larger or smaller area then the rear face of the microelectronic element.

As seen in FIGS. 11A-D, the encapsulation 16 may be formed at different regions and at different points in the procedure resulting in microelectronic units with different configurations. In one example, the encapsulation may be formed prior to the placement of the microelectronic element onto the reconstituted assembly, as seen in FIG. 11C. Alternatively, the encapsulation may be formed after the placement of the microelectronic element, which may allow the encapsulant to directly contact the microelectronic elements. In the latter example, the dielectric encapsulation may cover a large portion of the microelectronic element and surround all of the sidewalls and the rear face of the microelectronic element (i.e., five of the six sides of the microelectronic element), as seen in 11A.

In another example, as seen in FIG. 11B the encapsulation may surround the sidewalls of the microelectronic elements but may only extend laterally outward in a horizontal direction from the microelectronic element and overly neither the front face nor the rear face of the microelectronic element 12. As shown in FIG. 11C, there may be a configuration where the encapsulant is formed such that it surrounds the microelectronic element but there is a substantial gap 7 between one or more sidewalls (e.g., all the sidewalls) of the microelectronic element and the surrounding encapsulation.

Figure 12A:
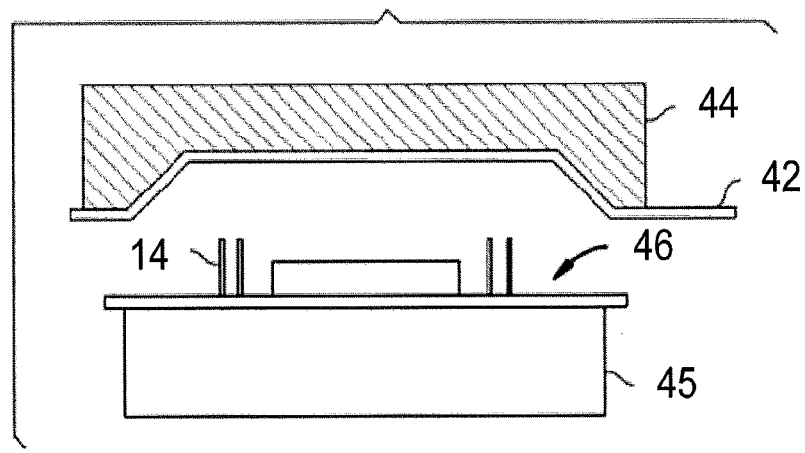
FIGS. 12A-B are sectional views illustrating one stage and another stage subsequent thereto in a method of forming an encapsulation layer of a microelectronic unit according to an embodiment of the invention.
Figure 12B:
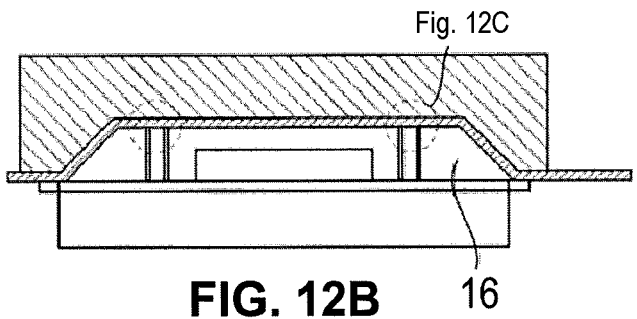
Figure 12C:
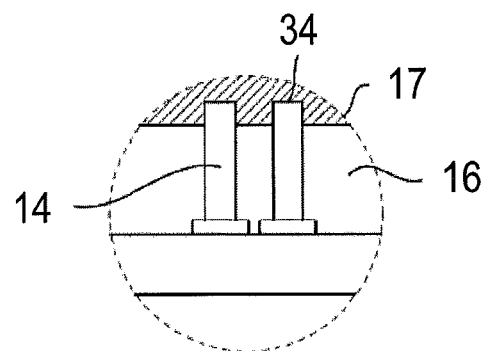
FIG. 12C is an enlarged sectional view further illustrating the stage corresponding to FIG. 12B.

Referring to FIG. 12A-C there is an example technique for forming encapsulation 16, which may result in unencapsulated portions of the connector elements 14 projecting beyond a surface 17 of the encapsulation 16. As seen in FIG. 12A, a film-assisted molding technique may be used by which a temporary film 42 is placed between a plate 44 of a mold and a cavity 46 in which a subassembly including the substrate, connector elements 14 joined thereto, and a component such as a microelectronic element may be joined. FIG. 12A further shows a second plate 45 of the mold which can be disposed opposite the first plate 44.

Then, as seen in FIGS. 12A-C, when the mold plates 44 and 45 are brought together, the free ends 34 of connector elements 14 can project into the temporary film 42. When a mold compound is flowed in the cavity 46 to form encapsulation 16, the mold compound does not contact the free ends of the connector elements 14 because they are covered by the temporary film 42. After this step, the mold plates 44, 45 are removed from the encapsulation layer 16, the temporary film 42 can now be removed from the mold surface 17, which then leaves the free ends of the connector elements 14 projecting beyond the surface 17 of the encapsulation layer 16.

The film assisted molding technique may be well adapted for mass production. For example, in one example of the process, a portion of a continuous sheet of the temporary film can be applied to the mold plate. Then the encapsulation layer can be formed in a cavity 46 that is at least partially defined by the mold plate. Then, a current portion of the temporary film 42 on the mold plate 44 can be replaced by automated means with another portion of the continuous sheet of the temporary film.

In a variation of the film assisted molding technique, instead of using a removable film as described above, a water soluble film can be placed on an inner surface of the mold plate 44 prior to forming the encapsulation layer. When the mold plates are removed, the water soluble film can be removed by washing it away so as to leave the ends of the connector elements 14 projecting beyond the surface 17 of the encapsulation layer as described above.

The encapsulation may also be formed using an alternate techniques, for example, encapsulation 16 may be formed by completely covering connector elements 14, including ends (e.g., ends 26) with the encapsulation. The encapsulation may include a sacrificial portion (e.g., layer) which may be subsequently removed to expose the second ends. The sacrificial portion may be removed by etching, planarizing, lapping, grinding, wet blasting (e.g., aluminum slurry), polishing or the like. This may reduce the height of the encapsulant to the desired height for connector elements 14.

The planarization of the sacrificial portion (e.g., sacrificial layer) can begin by reducing the height thereof to a point where the connector elements 14 become exposed at the surface of the sacrificial layer. The planarization process can then also planarize the connector elements 14 simultaneously with the sacrificial layer such that, as the height of the sacrificial layer is continued to be reduced, the heights of the connector elements 14 are also reduced. The planarization can be stopped once the desired height for the connector elements 14 is reached. It is noted that in such a process the connector elements 14 can be initially formed such that their heights, while being non-uniform, are all greater than the targeted uniform height. After planarization processes the connector elements 14 to the uniform or redfuced height, the sacrificial layer can be removed such as by etching or the like. The sacrificial portion may be formed from a material that is the same as the encapsulant or may be different, which may allow for removal by etching using an etchant that will not significantly affect the encapsulant material. In one example, the sacrificial layer can be made from a water soluble plastic material.

Figure 13A:
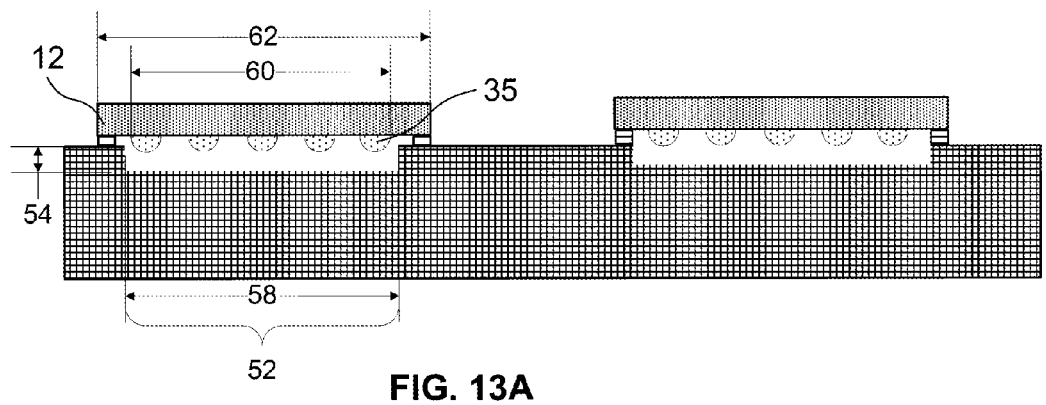
FIGS. 13A-B are sectional views depicting variations of the carrier according to an embodiment of the invention.
Figure 13B:
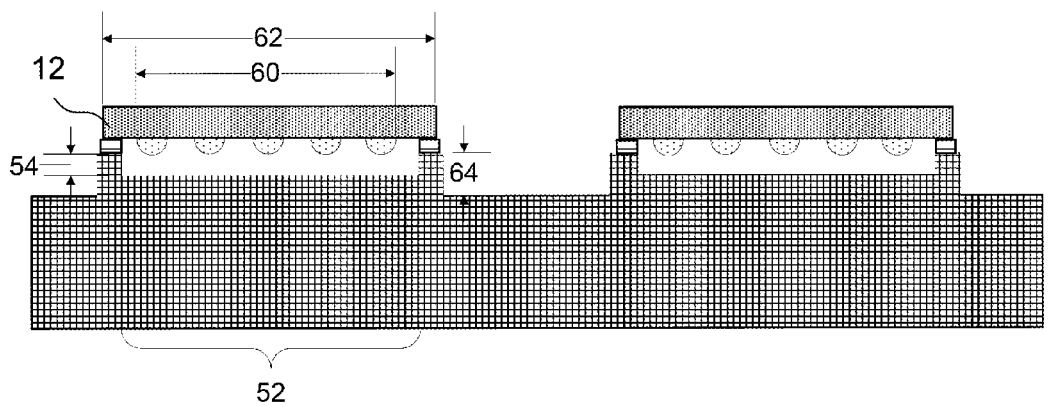

Referring to FIGS. 13A and 13B, the carrier used for the reconstituted assembly may have a substantially flat surface or the surface may include recessed and/or raised attachment regions. The non-flat attachment regions may be configured to allow a previously bumped microelectronic element to be releasably attached face down on the carrier. As seen in FIG. 13A, the recessed portion 52 may have a depth 54 that is configured to accommodate the thickness of the solder bumps 35, for example, the depth may be larger than the thickness of the solder bumps or it may be slightly smaller which may result in a slight deformation of the bumps. The width 58 of the recessed portion may be configured to be larger than the width 60 of the portion of the active face that includes electrical contacts (e.g., pads, solderbumps). Yet the recess width 58 may be smaller than the width 62 of the microelectronic element 12, which may allow the microelectronic element to be suspended above and/or bridge the recess.

Referring to FIGS. 13A and 13B, the carrier used for the reconstituted assembly may have a substantially flat surface or the surface may include recessed and/or raised attachment regions. The non-flat attachment regions may be configured to allow a previously bumped microelectronic element to be releasably attached face down on the carrier. As seen in FIG. 13A, the recessed portion 52 may have a depth 54 that is configured to accommodate the thickness of the solder bumps 56, for example, the depth may be larger than the thickness of the solder bumps or it may be slightly smaller which may result in a slight deformation of the bumps. The width 58 of the recessed portion may be configured to be larger than the width 60 of the portion of the active face that includes electrical contacts (e.g., pads, solderbumps). Yet the recess width 58 may be smaller than the width 62 of the microelectronic element 12, which may allow the microelectronic element to be suspended above and/or bridge the recess.

Before or after attaching the microelectronic element 12 to the carrier 13 in FIG. 13A, connector elements 14 and terminals provided by the conductive elements 29 at ends of connector elements 14 can be formed, such as described above relative to FIG. 8. Then, once these features 14, 29, and the microelectronic element 12 are provided, the encapsulation 16 can be provided and further processing performed to provide a redistribution layer such as described above relative to FIG. 9. As seen in FIG. 13B, the non-flat attachment regions may include portions that are both raised and recessed. This may allow the microelectronic element 12 to be optimally positioned within the microelectronic unit. In one example, the microelectronic element may be slightly raised a height 64 above the surface of the carrier, alternatively the microelectronic element may be position such that the active face or the bottom of the bumps on the active face are along the same plane as the free ends 34 of the connector elements.

Figure 14:
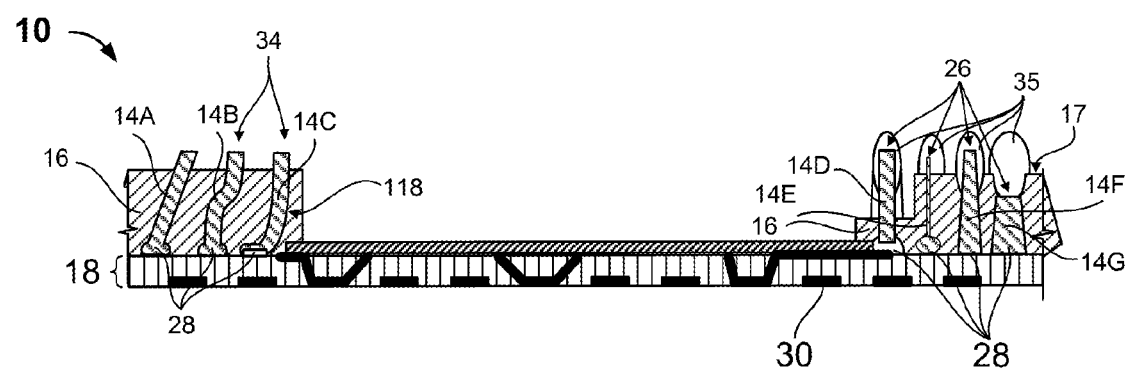
FIG. 14 is a sectional views depicting variations in the connector elements and encapsulation according to an embodiment of the invention.

As seen in FIG. 14, any or all of the microelectronic units and methods described above may include any combination of connector elements having various shapes leading to various relative lateral displacements between bases and ends thereof. For example, connector elements 14 can be substantially straight with second ends 26 positioned above their respective first ends (e.g., bases) 28 as seen in elements 14D and examples discussed above, in this situation the pitch of the first ends and the second ends may be the same. In one example, connector elements 14A can be straight, but second ends 26 may be displaced in a lateral direction from the respective first ends 28. In another example, connector elements (e.g., elements 14B) can include a curved portion 118 leading to a somewhat slight relative lateral displacement between first end 28 and second end 26. In yet another example, connector elements (e.g., elements 14C) include curved portions 118 having a sweeping shape that result in second ends 26 that are laterally displaced from the the respective bases 28 at a greater distance than those seen in 14B.

The lateral displacement of first ends 28 of the connector elements 14 relative to the second ends 26 of the connector elements may result in a first center-to-center spacing (first pitch) of the connector elements 14 at the first ends 28 which is different from a second center-to-center spacing (second pitch) at the second ends 26 of the connector elements, the second pitch being less than or greater than the first pitch. The conductive terminals 30 of the microelectronic unit 10 can be set at a third center-to-center pitch which can be equal to or larger than either the first and/or second pitches. The conductive terminals 30 may be electrically coupled with all, or only a portion of the connector elements 14. The conductive terminals 30 may overlie the microlectronic element 12 and/or the adjacent encapsulation 16 and may span an entire side, or a large portion of a side of the microelectronic unit 10 (e.g., package). In one example, the pitch of the first and second ends may have the same value (e.g., 240 micrometers) and the pitch of the conductive terminals may be larger (e.g., 400 micrometers).

The curved portions 118 of connector elements 14 may take on a variety of shapes, as needed, to achieve the desired position of the end 26 of the connector element 14. For example, the curved portions 118 may be formed as S-curves of various shapes, such as included in wire bond 14B, or of a smoother form as in wire bond 14C. Additionally, the curved portion 118 may be positioned closer to base 28 than to end 26 or vice-versa. The curved portion 118 may also be in the form of a spiral or loop, or may be compound including curves in multiple directions or of different shapes or characters.

The curved portion 118 may be formed during, for example, a wire bond formation process and may occur while the wire portion is being drawn out to the desired length. This step may be carried out using available wire-bonding equipment, which may include the use of a single machine.

The connector elements 14 may also include conductive joining masses 35 (e.g., stud bumps) at the free ends 34 (e.g., ends). This may assist with providing a connection to another conductive element. Conductive mass may be joined to the uncapsulated free ends, as seen in elements 14D-G. In one example the conductive mass may be joined to the free end and allowed to wick along edge surface 27 and join thereto in addition to joining to free end.

Referring again to FIG. 14, the structure 14D-14G may include a connector element in the form of posts or micro-pillar having an end 26 and an edge surface. The connector element 14F-G may have a frustoconical shape with tapered sidewalls. The connector element 14G may have an end 26 wider in cross-section than a cross-section of a portion between the base 28 and end 26, where the base 28 and end 26 are parallel and edge surfaces extend tapered toward each other from the base 28 to the end 26. In one example, the base 28 of connector element 14, or a conductive element or pad at the base 28 may be formed integrally with the connector element 14, such as seen in the case of connector elements 14A, such that the conductive element is not a separate element to which the respective connector element 14 is joined.

In a further embodiment, the connector element may be in the form of micropillar 14G having an end 26 that is at a height that is lower than the major surface 17 of the encapsulant 16. In order to expose the second end 26 the encapsulation 16 may be configured to include an area that has been etched away, molded, or otherwise formed to define an opening or cavity extending from surface 17 at least to the free end 26. The cavity may have any suitable shape to permit electrical connection at end 26 of connector element 14G that may be formed in the cavity, such as by deposition of electrically conductive material therein. In one example, Conductive joining mass 35 may be deposited in the cavity and extend from the end 26 to above the major surface 17 of encapsulant 16 and along portions of the surface 17 extending away from the cavity.

Figure 15A:
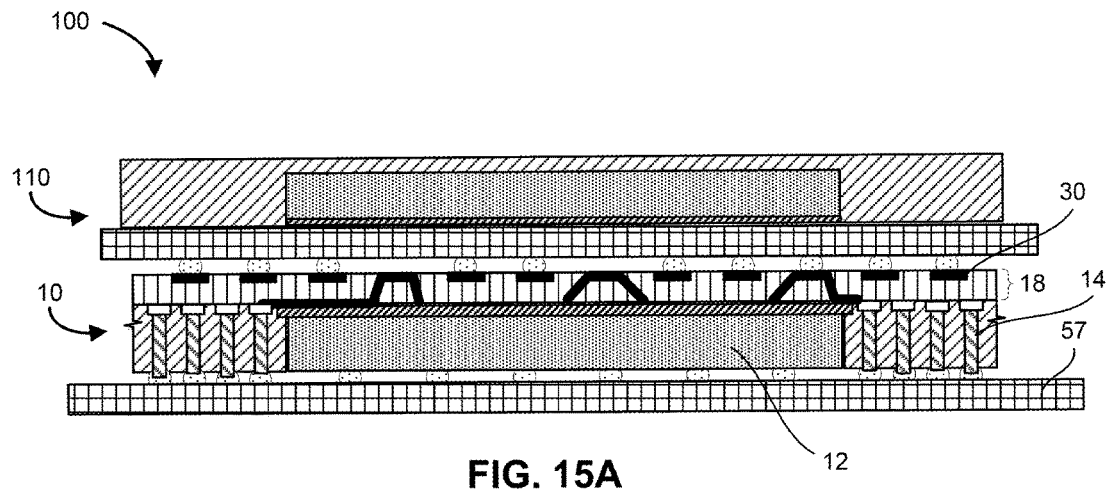
FIGS. 15A-B are sectional views depicting a microelectronic unit arranged in a stacked assembly according to embodiments of the invention.
Figure 15B:
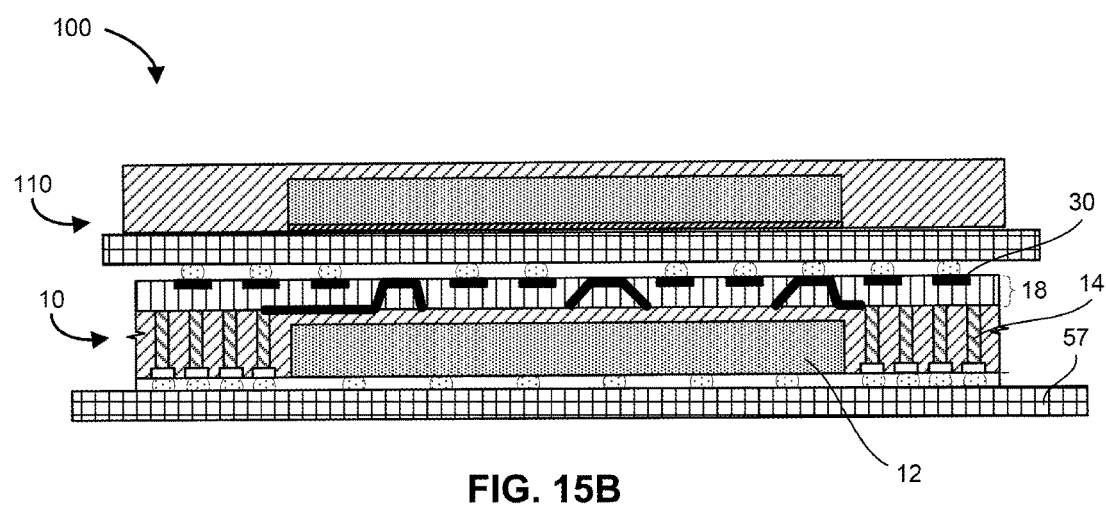

As seen in FIG. 15A and 15B, the microelectronic unit 10 shown in FIG. 1A or 1B can be assembled with other components such as a lower component 57 below the unit 10 and another microelectronic package 110 above the unit 10 in a "package on package" (PoP) stacked assembly 100. In examples, lower component 57 may be a printed circuit board, interposer, microelectronic element, or microelectronic package, to which microelectronic element 12 can be flip-chip attached, and electrical connections to the terminals 30 can extend through microelectronic unit 10 via the connector elements 14 of the microelectronic unit. For example, the microelectronic unit 10 may have two different sets of electrical connections at different pitches. The first set of connections may include conductive elements on the front face of the microelectronic element 12 and electrically couple the microelectronic element 12 to lower component 57. The second set of connections may be the connector elements 14 which may electrically couple microelectronic package 110 with lower component 57. In one embodiment, the first set of connections may be the only electrical connections between the microelectronic element 12 and lower component 57 and the second set of connections may be the only electrical connections between microelectronic package 110 and lower component 57. Alternatively a portion of either set may be used to electrically couple a package to the lower component 57.

As seen in FIGS. 15A and 15B, the redistribution layer 18 and terminals 30 of microelectronic unit 10 can be at a different pitch than the terminals of lower component 57, e.g., terminals 30 may have a pitch larger than the pitch of the connector elements present around the periphery of the microelectric unit 10 outside the microelectronic element 12. In one example, this may allow more relaxed pitch for testing the microelectronic unit 10 at the top terminals and may allow for a microelectronic package 110 or component having a more relaxed pitch to be electrically coupled with the top terminals 30 of the unit.

Figure 16:
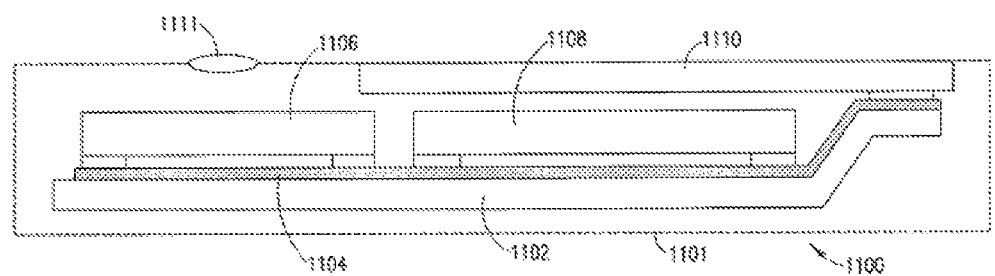
FIG. 16 is a schematic sectional view illustrating a system according to an embodiment of the invention.

As seen in FIG. 16, the microelectronic packages and microelectronic assemblies described above with reference to FIGS. 1A+B, FIG. 10-11D and FIG. 14-15B can be utilized in construction of diverse electronic systems, such as the system 1100 shown in FIG. 16. For example, the system 1100 in accordance with a further embodiment of the invention includes a plurality of modules or components 1106 such as the microelectronic packages and/or microelectronic assemblies as described above in conjunction with other electronic components 1108 and 1110.

In the exemplary system 1100 shown, the system can include a circuit panel, motherboard, or riser panel 1102 such as a flexible printed circuit board, and the circuit panel can include numerous conductors 1104, of which only one is depicted in FIG. 16, interconnecting the modules or components 1106 with one another. Such a circuit panel 1102 can transport signals to and from each of the microelectronic packages and/or microelectronic assemblies included in the system 1100. However, this is merely exemplary; any suitable structure for making electrical connections between the modules or components 1106 can be used.

In a particular embodiment, the system 1100 can also include a processor such as the semiconductor chip 1108, such that each module or component 1106 can be configured to transfer a number N of data bits in parallel in a clock cycle, and the processor can be configured to transfer a number M of data bits in parallel in a clock cycle, M being greater than or equal to N. In the example depicted in FIG. 16, component 1108 can be a semiconductor chip and component 1110 is a display screen, but any other components can be used in the system 1100. Of course, although only two additional components 1108 and 1110 are depicted in FIG. 16 for clarity of illustration, the system 1100 can include any number of such components.

Modules or components 1106 and components 1108 and 1110 can be mounted in a common housing 1101, schematically depicted in broken lines, and can be electrically interconnected with one another as necessary to form the desired circuit. The housing 1101 is depicted as a portable housing of the type usable, for example, in a smartphone, tablet computer, television, or cellular telephone, and screen 1110 can be exposed at the surface of the housing. In embodiments where a structure 1106 includes a light-sensitive element such as an imaging chip, a lens 1111 or other optical device also can be provided for routing light to the structure. Again, the simplified system shown in FIG. 16 is merely exemplary; other systems, including systems commonly regarded as fixed structures, such as desktop computers, routers and the like can be made using the structures discussed above.

It is to be understood that, in accordance with the disclosure, a structure may include other configurations by which a portion of a connector element is uncovered by an encapsulation element, such at an end surface and optionally along an edge surface thereof, which are similar to those discussed herein with respect to the variations of the configuration of the surface of the encapsulation element remote and facing away from the surface of the substrate.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method for making a microelectronic unit, comprising the steps of:
providing an electrically conductive redistribution structure on a carrier and providing a microelectronic element attachment region of the redistribution structure;
forming a plurality of electrically conductive connector elements adjacent opposite ends of the attachment region, each connector element having a first end, a second, end and edge surfaces extending vertically between the first and second ends, the first end of each connector element being adjacent the redistribution structure and the second end of each connector element at a height greater than 50 microns above the carrier; and
forming a dielectric encapsulation between adjacent edge surfaces of the connector elements,
wherein the microelectronic unit includes a microelectronic element coupled to the attachment region, the microelectronic element having a first face which faces away from the redistribution structure, the microelectronic element having element contacts at the first face that are configured for joining with corresponding component contacts of a component external to the microelectronic unit through electrically conductive masses in a state in which the element contacts are juxtaposed with the corresponding component contacts.

2. The method of claim 1, wherein forming the plurality of electrically conductive connector elements comprises forming wire bonds attached to pads of the redistribution structure.

3. The method of claim 2, wherein the electrically conductive connector elements are the wire bonds, the second ends of the connector elements are defined by ends of the wire bonds, the encapsulation has a surface overlying and facing away from the redistribution structure, wherein the second ends of the connector elements project above the surface.

4. The method of claim 1, wherein forming the dielectric encapsulation comprises flowing a mold compound into a cavity of a mold to surround the connector elements in a state in which portions of the connector elements are covered by a film, and thereafter removing the film such that the second ends of the connector elements project above the surface of the dielectric encapsulation.

5. The method of claim 1, wherein forming the dielectric encapsulation includes:
forming the dielectric encapsulation over the second ends of the connector elements and adjacent sidewalls of the microelectronic elements; and
removing the dielectric encapsulation overlying the second ends such that the second ends of the connector elements project above the surface of the dielectric encapsulation.

6. A method for making a microelectronic unit, comprising the steps of:
providing a carrier with a microelectronic element attachment region at a surface of the carrier;
forming a plurality of electrically conductive connector elements adjacent opposite ends of the attachment region, each connector element having a first end, a second end and edge surfaces extending vertically between the first and second ends, the first end of each connector element being adjacent the carrier and the second end of each connector element at a height greater than 50 microns above the carrier;
attaching a microelectronic element to the attachment region on the carrier, the microelectronic element having a first face, a second face and sidewalls extending between the first face and the second face, the first face having contacts and facing the carrier;
forming a dielectric encapsulation between adjacent edge surfaces of the connector elements; and
forming an electrically conductive redistribution structure overlying at least a surface of the encapsulation opposite from the first face of the microelectronic element, the redistribution structure coupled to the second ends of the connector elements and having traces extending in at least the first direction,
wherein the microelectronic unit includes a microelectronic element coupled to the attachment region, a side of the microelectronic unit having the first face of the microelectronic element and the first ends of the connector elements available for connection with a component external to the microelectronic unit.

7. The method of claim 6, wherein forming the plurality of electrically conductive connector elements includes:
forming a conductive layer overlying the carrier;
patterning the conductive layer to form pads; and
attaching a wire bond or forming a conductive mass on the pads.

8. The method of claim 6, wherein forming the dielectric encapsulation comprises film assist molding wherein the second end of the connector element projects above a surface of the encapsulant.

9. The method of claim 6, wherein forming the dielectric encapsulation includes forming the dielectric encapsulation over the second ends of the connector elements and subsequently removing the dielectric encapsulation from the second ends.

10. The method of claim 6, wherein the electrically conductive connector elements are free of electrical connections to the microelectronic element.

11. A microelectronic package having a first side and a second side opposite from the first side, the package comprising:
a microelectronic element having a first face, a second face opposite the first face, a plurality of sidewalls each extending between the first and second faces, and a plurality of element contacts at the first face;
an encapsulation adjacent the sidewalls of the microelectronic element and having a thickness in a direction between the first and second sides of the package, wherein the element contacts are configured for joining with corresponding component contacts of a component external to the microelectronic package in a state in which the element contacts are juxtaposed with the corresponding component contacts;

electrically conductive connector elements each having a first end, a second end remote from the first end, and an edge surface extending between the first and second ends, wherein one of the first end or the second end of each connector element is adjacent the first side of the package, the connector elements being contacted by the encapsulation between the first and second ends, the connector elements configured for electrically coupling a first external component adjacent the first side with a second external component adjacent the second side; and a redistribution structure having terminals, the redistribution structure adjacent the second side of the package and opposite the first face of the microelectronic element, the terminals being electrically coupled with the connector elements, the other of the first end or the second end of each connector element being adjacent the redistribution structure.

12. The microelectronic package of claim 11, wherein the terminals are laterally spaced apart from the connector elements to which the terminals are electrically coupled, respectively.

13. The microelectronic package of claim 12, wherein the encapsulation has a surface overlying and facing away from the redistribution structure, the first end of a given connector element is adjacent the redistribution structure and the second end of a given connector element is at the first side of the package and protrudes beyond the surface of the encapsulation.

14. The microelectronic package of claim 13, wherein the connector elements are wire bonds.

15. The microelectronic package of claim 14, wherein the wire bonds have balls at the first ends, and the second ends of the connector elements are defined by ends of the wire bonds and the second ends project above the surface of the encapsulation.

16. The package of claim 11, wherein the electrically conductive connector elements are free of electrical connections to the microelectronic element.

17. The microelectronic package of claim 11, further comprising conductive joining masses formed at the first side of the microelectronic package, at least one conductive joining mass configured to electrically couple the microelectronic element to the first external component and at least one conductive joining mass configured to electrically couple the connector element to the first external component.

18. The microelectronic package of claim 11, wherein each connector element comprises a bond metal mass.

19. The microelectronic package of claim 11, wherein each connector element comprises a solder mass.

20. The microelectronic package of claim 19, wherein each connector element further comprises at least a portion of a pad to which the solder mass is joined.

* * * * *